US008018290B2

(12) United States Patent
Mizutani et al.

(10) Patent No.: US 8,018,290 B2
(45) Date of Patent: Sep. 13, 2011

(54) OSCILLATOR, TRANSMITTER-RECEIVER AND FREQUENCY SYNTHESIZER

(75) Inventors: Hiroyuki Mizutani, Tokyo (JP); Kazuhiro Nishida, Tokyo (JP); Masaomi Tsuru, Tokyo (JP); Kenji Kawakami, Tokyo (JP); Morishige Hieda, Tokyo (JP); Moriyasu Miyazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 213 days.

(21) Appl. No.: 12/439,764

(22) PCT Filed: Oct. 15, 2007

(86) PCT No.: PCT/JP2007/070091
§ 371 (c)(1),
(2), (4) Date: Mar. 3, 2009

(87) PCT Pub. No.: WO2008/047763
PCT Pub. Date: Apr. 24, 2008

(65) Prior Publication Data
US 2010/0045348 A1 Feb. 25, 2010

(30) Foreign Application Priority Data

Oct. 17, 2006 (JP) .................................. 2006-282816
Mar. 27, 2007 (JP) .................................. 2007-082134

(51) Int. Cl.
*H03B 25/00* (2006.01)

(52) U.S. Cl. ............. 331/60; 331/36 R; 331/96; 331/99; 331/107 SL; 331/117 D; 327/105; 327/119; 327/122; 327/123; 330/277; 330/286; 330/302; 330/305; 333/32; 333/33; 333/218

(58) Field of Classification Search .................... 331/60, 331/96, 99, 117 D, 107 SL, 36 R; 327/105, 327/119, 122, 123; 330/277, 286, 302, 305; 333/32, 33, 218
See application file for complete search history.

(56) References Cited

U.S. PATENT DOCUMENTS
4,310,809 A 1/1982 Buck et al.
(Continued)

FOREIGN PATENT DOCUMENTS
EP 0 696 843 A1 2/1996
(Continued)

OTHER PUBLICATIONS

Author: Hamano, S.; Kawakami, K.; Takagi, T.; Title: A low phase noise 19 GHz-band VCO using two different frequency resonators Date: Jun. 8-13, 2003 Publisher: IEEE vol. 2189-2192 vol. 3.*

(Continued)

*Primary Examiner* — Arnold Kinkead
*Assistant Examiner* — Richard Tan
(74) *Attorney, Agent, or Firm* — Oblon, Spivak, McClelland, Maier & Neustadt, L.L.P.

(57) ABSTRACT

An output terminal 6 is provided at the connecting point 5 between the collector terminal of a transistor 1 and an open-ended stub 4 by connecting the open-ended stub 4 to the collector terminal of the transistor 1, the open-ended stub 4 having a line length equal to a quarter of the wavelength of a signal of frequency $2N \cdot F_0$ or 2N times the oscillation frequency $F_0$. In addition, an output terminal 9 is provided at a connecting point 8 located at a distance equal to a quarter of the wavelength of a signal of oscillation frequency $F_0$ from the end of an open-ended stub 7 by connecting the open-ended stub 7 to the base terminal of the transistor 1, the open-ended stub 7 having a line length longer than a quarter of the wavelength of the signal of oscillation frequency $F_0$.

24 Claims, 13 Drawing Sheets

U.S. PATENT DOCUMENTS

| | | | |
|---|---|---|---|
| 4,484,156 A | 11/1984 | Khanna et al. | |
| 4,518,931 A * | 5/1985 | Rauscher | 331/76 |
| 5,349,364 A * | 9/1994 | Bryanos et al. | 333/116 |
| 5,592,122 A * | 1/1997 | Masahiro et al. | 330/286 |
| 5,606,737 A * | 2/1997 | Suzuki et al. | 455/319 |
| 5,886,595 A * | 3/1999 | Von Stein | 333/218 |
| 6,124,767 A * | 9/2000 | Woods | 331/117 D |
| 6,362,685 B1 * | 3/2002 | Vagher | 330/124 R |
| 6,369,675 B2 * | 4/2002 | Yamada | 333/218 |
| 6,388,546 B1 * | 5/2002 | Kikokawa et al. | 333/218 |
| 6,441,692 B1 * | 8/2002 | Nakatani et al. | 331/42 |
| 6,794,953 B2 * | 9/2004 | Brandt | 333/116 |
| 7,378,915 B2 * | 5/2008 | Adachi et al. | 331/117 D |

FOREIGN PATENT DOCUMENTS

| | | |
|---|---|---|
| JP | 10 126152 | 5/1998 |
| JP | 10 242849 | 9/1998 |
| JP | 2000 223944 | 8/2000 |
| JP | 2001 144537 | 5/2001 |
| JP | 2002 261544 | 9/2002 |

OTHER PUBLICATIONS

Mizutani, H. et al., "A Study on a Reflection-Type Dual-Frequency VCO With a Coupled Line", The Institute of Electronics, Information and Communication Engineers (IEICE), p. 32 (2007) (with partial English translation).

* cited by examiner

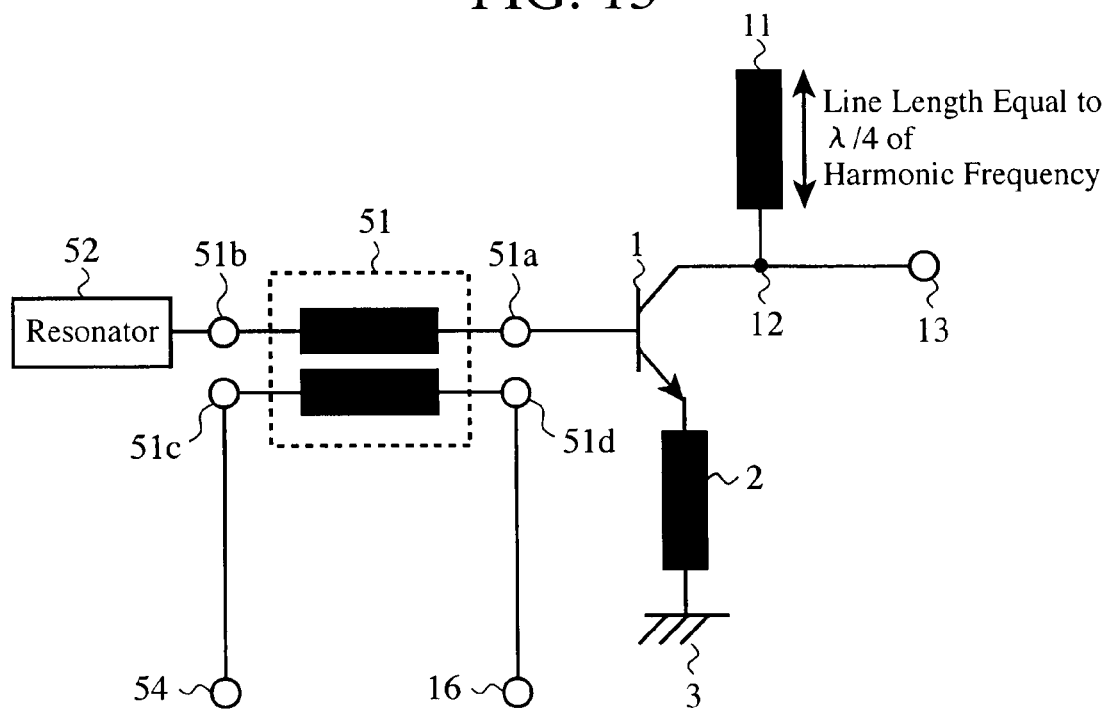
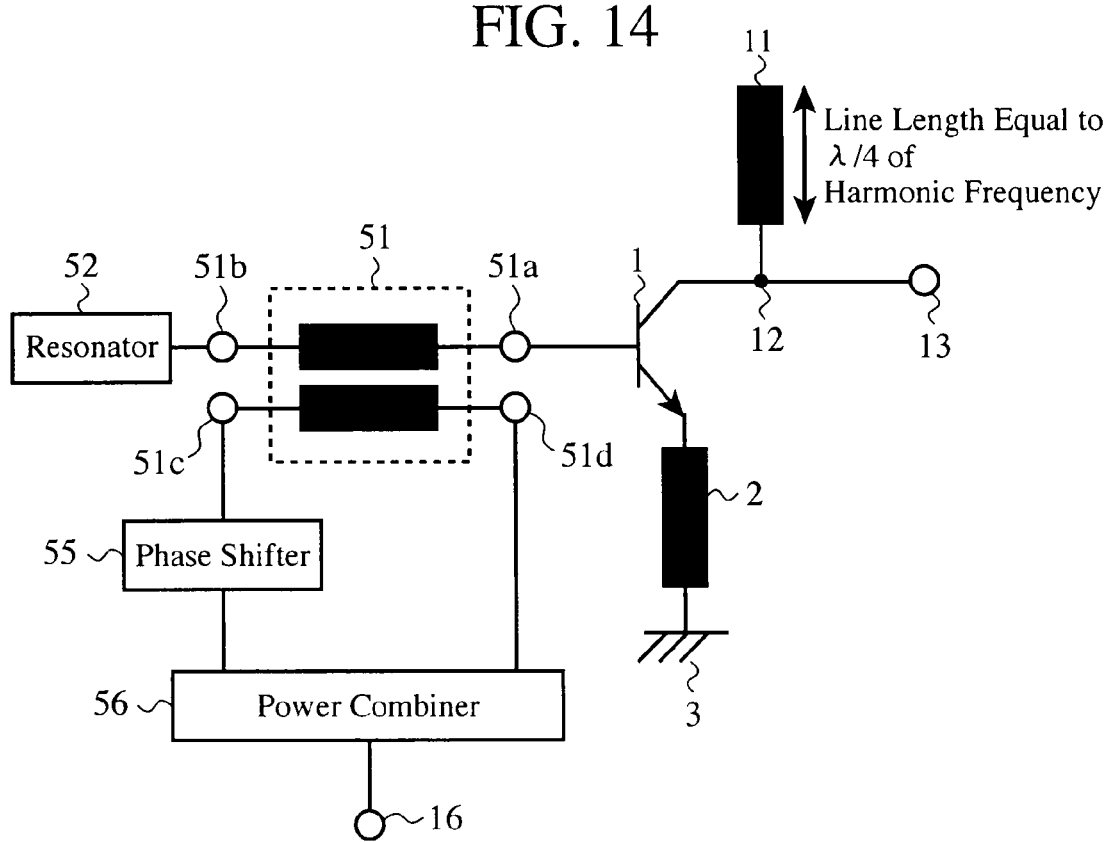

OSCILLATOR, TRANSMITTER-RECEIVER AND FREQUENCY SYNTHESIZER

TECHNICAL FIELD

The present invention relates to an oscillator used as a signal source of a communication system or radar system, for example, and to a transmitter-receiver and a frequency synthesizer including the oscillator.

BACKGROUND ART

A common radar system has an oscillator for generating a signal of frequency Fo, a distributor for splitting the signal of frequency Fo produced from the oscillator into two parts, and a frequency multiplier for multiplying the frequency of the signal of frequency Fo, which is a signal split by the distributor, and for outputting a signal of frequency 2N·Fo.

The radar system has a transmitter for transmitting the signal of frequency 2N·Fo output from the frequency multiplier to a target as a transmitted signal; a receiver for receiving the signal of frequency 2N·Fo transmitted from the transmitter and reflected by the target; a mixer for mixing the signal received by the receiver with the signal of frequency Fo which is the signal distributed by the distributor and functions as a local oscillator signal; and a signal processor for obtaining a signal necessary for calculating the position and relative velocity of the target from the signal mixed by the mixer.

The foregoing common radar system includes the distributor and the frequency multiplier in addition to the oscillator to obtain the signal of frequency Fo and the signal of frequency 2N·Fo, thereby complicating the circuit configuration of the radar system. In contrast, using a push-push oscillator disclosed in the following Patent Document 1 as the oscillator, for example, makes it possible to output both the signal of frequency Fo and signal of frequency 2N·Fo from different terminals and hence can simplify the circuit configuration.

Here, the push-push oscillator has two oscillating sections which are identical and symmetrical and operate in opposite phases.

Patent Document 1: Japanese Patent Laid-Open No. 2000-223944 (Paragraph [0017] and FIG. 1).

With the foregoing configuration, the conventional oscillator can output both the signal of frequency Fo and the signal of frequency 2N·Fo if it has the two oscillating sections which are identical and symmetrical and operate in opposite phases. However, since it must have two oscillating sections consisting of active elements, the circuit configuration become comparatively large. In addition, unless it is designed considering variations in the performance between the two active elements, it has a problem of being unable to output the signals of desired frequencies.

The present invention is implemented to solve the foregoing problems. Therefore it is an object of the present invention to provide an oscillator capable of outputting the signal of frequency Fo and the signal of frequency 2N·Fo without using the two active elements.

Another object of the present invention is to provide a transmitter-receiver and a frequency synthesizer including the oscillator.

DISCLOSURE OF THE INVENTION

An oscillator in accordance with the present invention provides a first output terminal for outputting a signal of the oscillation frequency generated by an active element at the connecting point between the collector terminal of the active element and a first open-ended stub by connecting the first open-ended stub, which has a line length equal to a quarter of the wavelength of a signal of 2N-fold frequency of the oscillation frequency, to the collector terminal of the active element; and a second output terminal for outputting the signal of 2N-fold frequency of the oscillation frequency generated by the active element at the position separated from an end of a second open-ended stub by a distance equal to a quarter of the wavelength of the signal of the oscillation frequency by connecting the second open-ended stub, which has a line length longer than a quarter of the wavelength of the signal of the oscillation frequency, to the base terminal of the active element.

This offers an advantage of being able to output the signal of the oscillation frequency and the signal of 2N-fold frequency of the oscillation frequency without using two active elements.

BRIEF DESCRIPTION OF THE DRAWINGS

FIG. 13 is a circuit diagram showing an oscillator of an embodiment 12 in accordance with the present invention;

FIG. 14 is a circuit diagram showing an oscillator of an embodiment 13 in accordance with the present invention;

BEST MODE FOR CARRYING OUT THE INVENTION

The best mode for carrying out the invention will now be described with reference to the accompanying drawings to explain the present invention in more detail.

Embodiment 1

Figure 1:
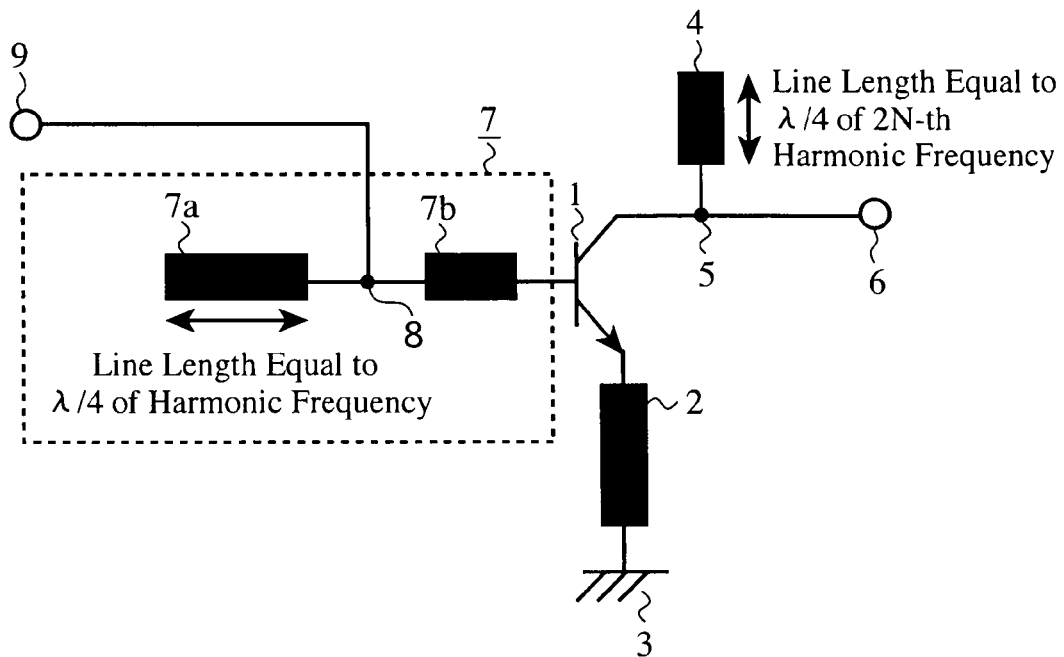
FIG. 1 is a circuit diagram showing an oscillator of an embodiment 1 in accordance with the present invention.

FIG. 1 is a circuit diagram showing an oscillator of an embodiment 1 in accordance with the present invention. In FIG. 1, a transistor 1 is an active element having nonlinear characteristics. The transistor 1 oscillates at an oscillation frequency $F_0$ and generates a signal of oscillation frequency $F_0$ (referred to as "oscillation frequency signal" from now on). In addition, it generates a signal of frequency $2N \cdot F_0$, that is, 2N times the oscillation frequency $F_0$ (referred to as "2N-th harmonic frequency signal" from now on), where N = 1, 2, 3, .... Incidentally, the transistor 1 generates signals with frequencies higher than the frequency $2N \cdot F_0$.

An inductor 2, which is connected between the emitter terminal of the transistor 1 and ground 3, is a passive element operating in such a manner as to give gain to the transistor 1 at the oscillation frequency $F_0$.

An open-ended stub 4 is a first open-ended stub connected to the collector terminal of the transistor 1. The open-ended stub 4 has a line length equal to a quarter of the wavelength of the 2N-th harmonic frequency signal generated from the transistor 1.

A connecting point 5 is a point at which the collector terminal of the transistor 1 is connected to the open-ended stub 4. The connecting point 5 becomes a short-circuiting point of the 2N-th harmonic frequency signal generated from the transistor 1 via the open-ended stub 4.

An output terminal 6 is a first output terminal provided at the connecting point 5. The output terminal 6 outputs the oscillation frequency signal generated from the transistor 1.

An open-ended stub 7 is a second open-ended stub connected to a base terminal of the transistor 1. The open-ended stub 7 has a line length longer than a quarter of the wavelength of the oscillation frequency signal generated from the transistor 1 (the line length necessary and sufficient for the transistor 1 to oscillate at the oscillation frequency $F_0$).

An end portion 7a of the open-ended stub 7 has a line length equal to a quarter of the wavelength of the oscillation frequency signal.

A non-end portion 7b of the open-ended stub 7 is connected to the base terminal of the transistor 1.

A connecting point 8 is provided between the end portion 7a and the non-end portion 7b of the open-ended stub 7. The connecting point 8 becomes a short-circuiting point of the oscillation frequency signal generated from the transistor 1 via the end portion 7a of the open-ended stub 7.

An output terminal 9 is a second output terminal provided at the connecting point 8. The output terminal 9 outputs the 2N-th harmonic frequency signal generated from the transistor 1.

Next, the operation will be described.

Since the transistor 1 is an active element having nonlinear characteristics, it generates, when oscillating at the oscillation frequency $F_0$, the 2N-th harmonic frequency signal of frequency $2N \cdot F_0$, which is one of the harmonics, besides the oscillation frequency signal of oscillation frequency $F_0$.

Here, since the open-ended stub 4 with a line length equal to a quarter of the wavelength of the 2N-th harmonic frequency signal generated from the transistor 1 is connected to the collector terminal of the transistor 1, the connecting point 5 between the collector terminal of the transistor 1 and the open-ended stub 4 becomes the short-circuiting point of the 2N-th harmonic frequency signal generated from the transistor 1. Thus, the 2N-th harmonic frequency signal undergoes total reflection.

Accordingly, the 2N-th harmonic frequency signal generated from the transistor 1 does not advance toward the output terminal 6 side so that only the oscillation frequency signal generated from the transistor 1 is output from the output terminal 6.

On the other hand, to the base terminal of the transistor 1, the open-ended stub 7 with a line length longer than a quarter of the wavelength of the oscillation frequency signal generated from the transistor 1 is connected, and the end portion 7a of the open-ended stub 7 has a line length equal to a quarter of the wavelength of the oscillation frequency signal. Accordingly, the connecting point 8 provided between the end portion 7a and the non-end portion 7b of the open-ended stub 7 becomes a short-circuiting point of the oscillation frequency signal generated from the transistor 1 so that the oscillation frequency signal undergoes total reflection.

Therefore the oscillation frequency signal generated from the transistor 1 does not advance toward the output terminal 9 side so that only the 2N-th harmonic frequency signal generated from the transistor 1 is output from the output terminal 9.

As is clear from the foregoing description, the present embodiment 1 is configured in such a manner that the output terminal 6 for outputting the oscillation frequency signal generated from the transistor 1 is provided at the connecting point 5 between the collector terminal of the transistor 1 and the open-ended stub 4 by connecting the open-ended stub 4 with the line length equal to a quarter of the wavelength of the signal of frequency $2N \cdot F_0$, or 2N times the oscillation frequency $F_0$, to the collector terminal of the transistor 1; and that the output terminal 9 for outputting the 2N-th harmonic frequency signal generated from the transistor 1 at the connecting point 8 which is located at the position separated by a distance equal to a quarter of the wavelength of the oscillation frequency signal $F_0$ from the edge of the open-ended stub 7 by connecting the open-ended stub 7 with the line length longer than a quarter of the wavelength of the oscillation frequency signal $F_0$ to the base terminal of the transistor 1. Thus, the present embodiment 1 can output the signal of oscillation frequency $F_0$ and the signal of frequency $2N \cdot F_0$, or 2N times the oscillation frequency $F_0$, without using two active elements, thereby offering an advantage of being able to simplify and miniaturize the circuit configuration.

Embodiment 2

Figure 2:
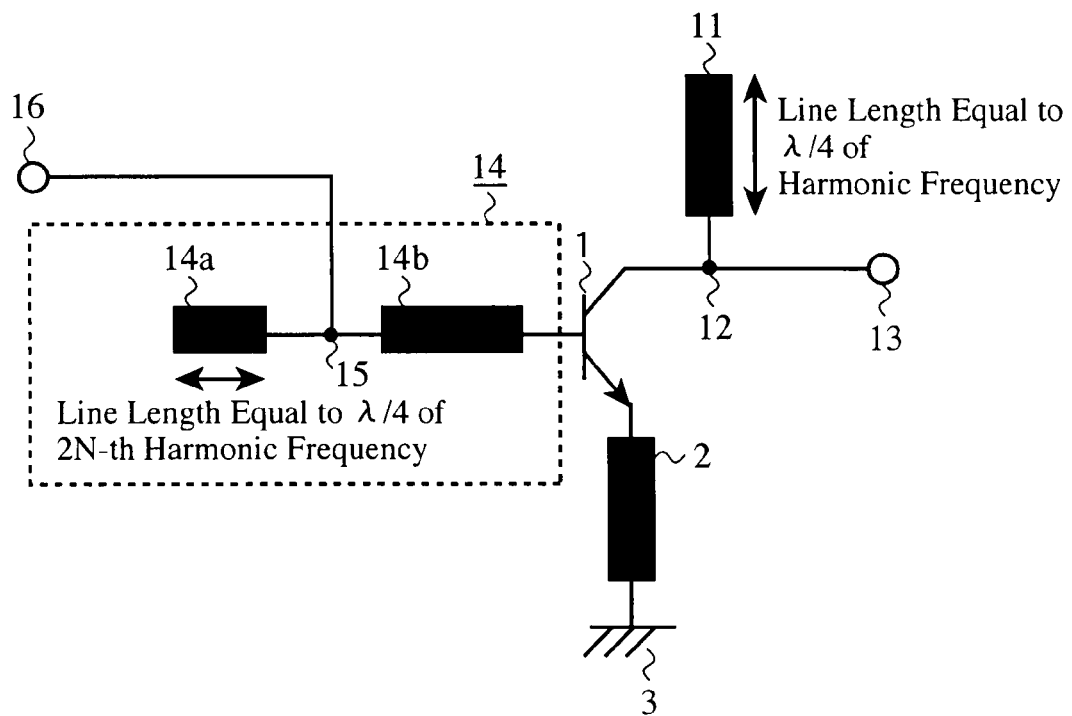
FIG. 2 is a circuit diagram showing an oscillator of an embodiment 2 in accordance with the present invention.

FIG. 2 is a circuit diagram showing an oscillator of an embodiment 2 in accordance with the present invention. In FIG. 2, since the same reference numerals as those of FIG. 1 designate the same or like portions, their description will be omitted.

An open-ended stub 11 is a first open-ended stub connected to the collector terminal of the transistor 1. The open-ended stub 11 has a line length equal to a quarter of the wavelength of the oscillation frequency signal generated from the transistor 1.

A connecting point 12 is a point at which the collector terminal of the transistor 1 is connected to the open-ended stub 11. The connecting point 12 becomes a short-circuiting point of the oscillation frequency signal generated from the transistor 1 via the open-ended stub 11.

An output terminal 13 is a first output terminal provided at the connecting point 12. The output terminal 13 outputs the 2N-th harmonic frequency signal generated from the transistor 1.

An open-ended stub 14 is a second open-ended stub connected to the base terminal of the transistor 1. The open-ended stub 14 has a line length longer than a quarter of the wavelength of the 2N-th harmonic frequency signal generated from the transistor 1 (line length necessary and sufficient for the transistor 1 to oscillate at the oscillation frequency $F_0$).

An end portion 14a of the open-ended stub 14 has a line length equal to a quarter of the wavelength of the 2N-th harmonic frequency signal.

A non-end portion 14b of the open-ended stub 14 is connected to the base terminal of the transistor 1.

A connecting point 15 is provided between the end portion 14a and the non-end portion 14b of the open-ended stub 14. The connecting point 15 becomes a short-circuiting point of the 2N-th harmonic frequency signal generated from the transistor 1 via the end portion 14a of the open-ended stub 14.

An output terminal 16 is a second output terminal provided at the connecting point 15. The output terminal 16 outputs the oscillation frequency signal generated from the transistor 1.

Next, the operation will be described.

Since the transistor 1 is an active element having nonlinear characteristics, it generates, when oscillating at the oscillation frequency $F_0$, the 2N-th harmonic frequency signal of frequency $2N \cdot F_0$, which is one of the harmonics, besides the oscillation frequency signal of oscillation frequency $F_0$.

Here, since the open-ended stub 11 with a line length equal to a quarter of the wavelength of the oscillation frequency signal generated from the transistor 1 is connected to the collector terminal of the transistor 1, the connecting point 12 between the collector terminal of the transistor 1 and the open-ended stub 11 becomes the short-circuiting point of the oscillation frequency signal generated from the transistor 1. Thus, the oscillation frequency signal undergoes total reflection.

Accordingly, the oscillation frequency signal generated from the transistor 1 does not advance toward the output terminal 13 side so that only the 2N-th harmonic frequency signal generated from the transistor 1 is output from the output terminal 13.

On the other hand, to the base terminal of the transistor 1, the open-ended stub 14 with a line length longer than a quarter of the wavelength of the 2N-th harmonic frequency signal generated from the transistor 1 is connected, and the end portion 14a of the open-ended stub 14 has a line length equal to a quarter of the wavelength of the 2N-th harmonic frequency signal. Accordingly, the connecting point 15 provided between the end portion 14a and the non-end portion 14b of the open-ended stub 14 becomes a short-circuiting point of the 2N-th harmonic frequency signal generated from the transistor 1 so that the 2N-th harmonic frequency signal undergoes total reflection.

Therefore the 2N-th harmonic frequency signal generated from the transistor 1 does not advance toward the output terminal 16 side so that only the oscillation frequency signal generated from the transistor 1 is output from the output terminal 16.

As is clear from the foregoing description, the present embodiment 2 is configured in such a manner that the output terminal 13 for outputting the 2N-th harmonic frequency signal generated from the transistor 1 is provided at the connecting point 12 between the collector terminal of the transistor 1 and the open-ended stub 11 by connecting the open-ended stub 11 with the line length equal to a quarter of the wavelength of the oscillation frequency signal $F_0$ to the collector terminal of the transistor 1; and that the output terminal 16 for outputting the oscillation frequency signal generated from the transistor 1 is provided at the connecting point 15 which is located at the position separated by a distance equal to a quarter of the wavelength of the signal with the frequency $2N \cdot F_0$, or 2N times the oscillation frequency $F_0$, from the edge of the open-ended stub 14 by connecting the open-ended stub 14 with the line length longer than a quarter of the wavelength of the signal with the frequency $2N \cdot F_0$, or 2N times the oscillation frequency $F_0$, to the base terminal of the transistor 1. Thus, the present embodiment 2 can output the signal of oscillation frequency $F_0$ and the signal of frequency $2N \cdot F_0$, or 2N times the oscillation frequency $F_0$, without using the two active elements, thereby offering an advantage of being able to simplify and miniaturize the circuit configuration.

In addition, since the present embodiment 2 outputs the 2N-th harmonic frequency signal from the output terminal 13 on the collector terminal side of the transistor 1, it offers an advantage of being able to increase the power of the 2N-th harmonic frequency signal as compared with the oscillator of the embodiment 1.

Embodiment 3

Figure 3:
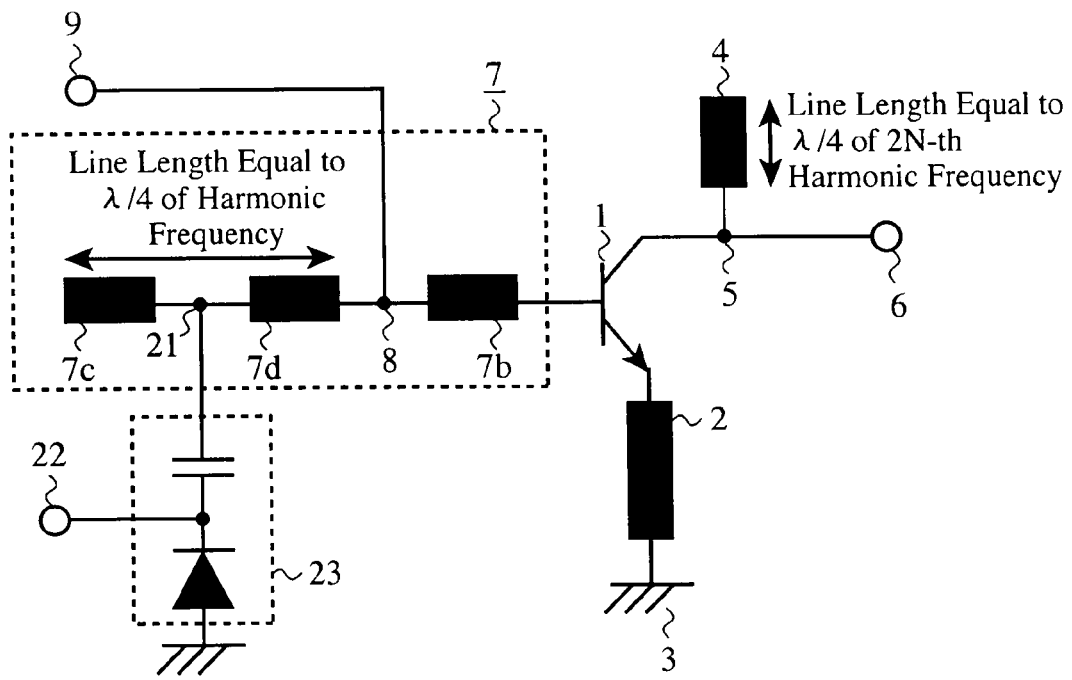
FIG. 3 is a circuit diagram showing an oscillator of an embodiment 3 in accordance with the present invention.

FIG. 3 is a circuit diagram showing an oscillator of an embodiment 3 in accordance with the present invention. In FIG. 3, since the same reference numerals as those of FIG. 1 designate the same or like portions, their description will be omitted.

An end portion 7c and an end portion 7d of the open-ended stub 7 correspond to the end portion 7a of the open-ended stub 7 in FIG. 1, and have a line length equal to a quarter of the wavelength of the signal of oscillation frequency $F_0$.

A connecting point 21, which is provided between the end portion 7c and end portion 7d, is connected to a varactor diode 23.

An input terminal 22 is a terminal for inputting external voltage.

The varactor diode 23, the capacitance of which varies in response to the external voltage input to the input terminal 22, is a setting device for setting the oscillation frequency $F_0$ of the transistor 1.

Next, the operation will be described.

In the foregoing embodiment 1, the oscillator is described in which the transistor 1 oscillates at the oscillation frequency $F_0$. However, the capacitance-variable varactor diode 23 can set the oscillation frequency $F_0$ of the transistor 1 in accordance with the external voltage so that the transistor 1 oscillates at the oscillation frequency $F_0$.

In other words, the varactor diode 23 has its internal capacitance varied in accordance with the external voltage input from the input terminal 22.

The oscillation frequency $F_0$ of the transistor 1 varies when the internal capacitance of the varactor diode 23 varies.

Accordingly, setting the external voltage input from the input terminal 22 appropriately makes it possible to set the oscillation frequency $F_0$ of the transistor 1 at a desired frequency.

As is clear from the foregoing description, the present embodiment 3 is configured in such a manner as to connect the capacitance-variable varactor diode 23 for setting the oscillation frequency $F_0$ of the transistor 1 to any given position of the open-ended stub 7. Accordingly, the present embodiment 3 offers an advantage of being able to set the oscillation frequency $F_0$ of the transistor 1 at a desired frequency.

In the present embodiment 3, an example is described which includes the capacitance-variable varactor diode 23 in the oscillator of FIG. 1. However, as shown in FIG. 4, the capacitance-variable varactor diode 23 can be placed in the oscillator of FIG. 2, which can offer the same advantage.

Figure 4:
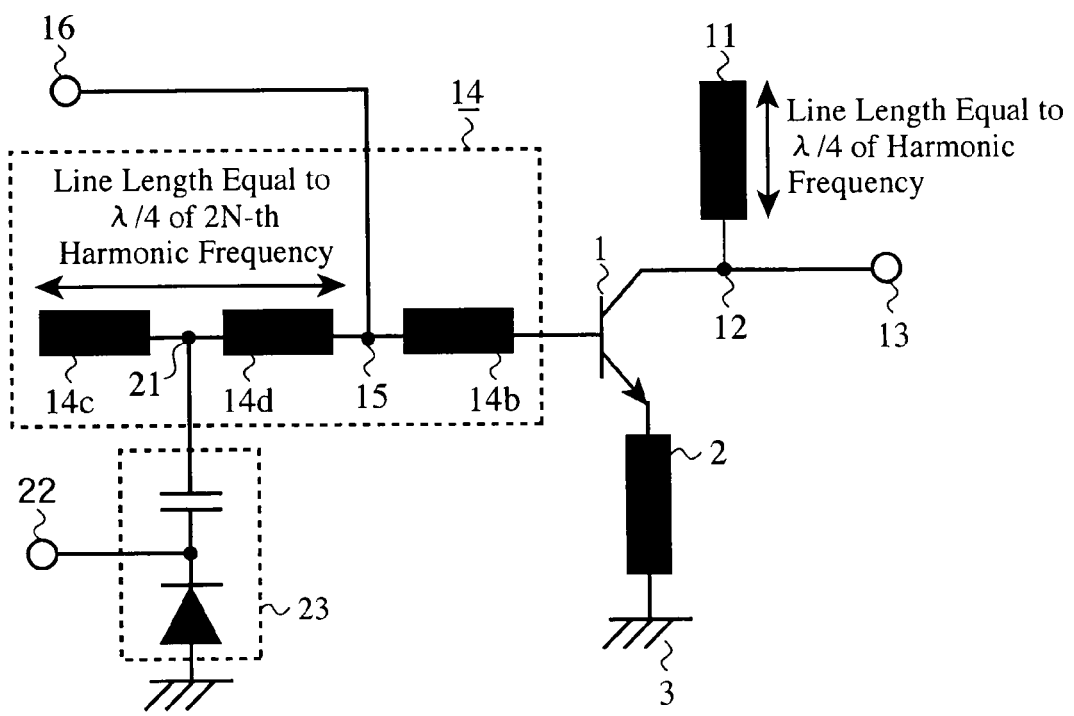
FIG. 4 is a circuit diagram showing an oscillator of the embodiment 3 in accordance with the present invention.

In FIG. 4, however, the end portion 14c and end portion 14d of the open-ended stub 14 correspond to the end portion 14a of the open-ended stub 14 of FIG. 2, and have a line length equal to a quarter of the wavelength of the signal of frequency $2N \cdot F_0$ or 2N times the oscillation frequency $F_0$.

Embodiment 4

Figure 5:
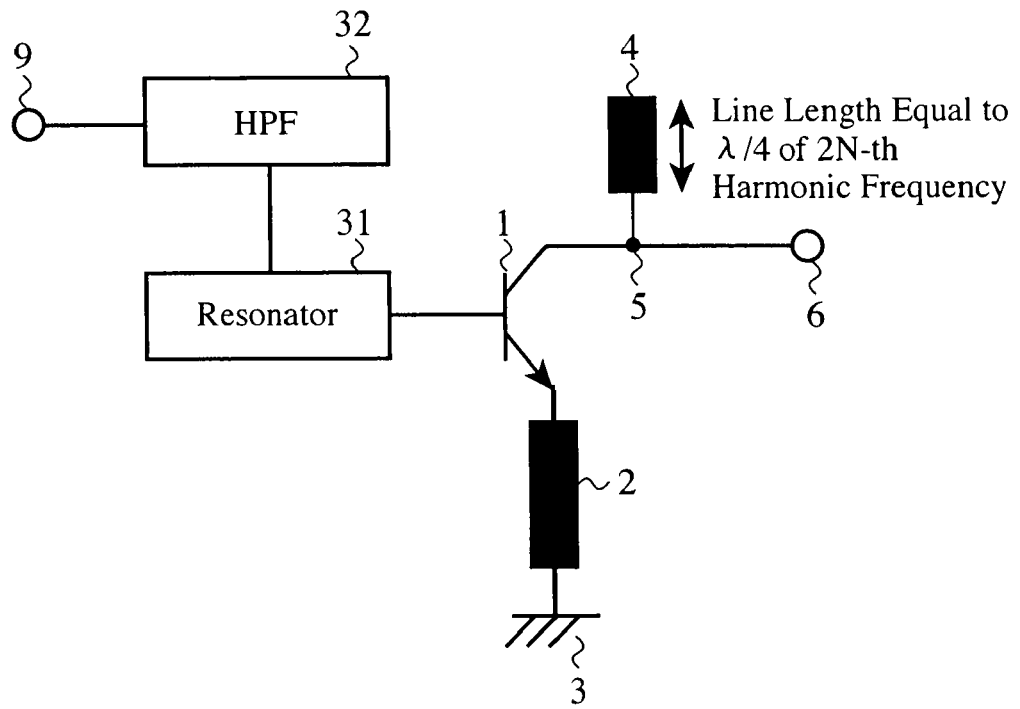
FIG. 5 is a block diagram showing an oscillator of an embodiment 4 in accordance with the present invention.

FIG. 5 is a circuit diagram showing an oscillator of an embodiment 4 in accordance with the present invention. In FIG. 5, since the same reference numerals as those of FIG. 1 designate the same or like portions, their description will be omitted.

A resonator 31, which is composed of an inductor and a capacitor connected in parallel, for example, is connected to the base terminal of the transistor 1. The resonator 31 has a high Q-value and resonates at the oscillation frequency $F_0$ of the transistor 1.

A HPF (High Pass Filter) 32 is connected to any given point of the resonator 31 except for the short-circuiting point of the frequency $2N \cdot F_0$, 2N times the oscillation frequency $F_0$. The HPF 32 is a filter that blocks the oscillation frequency signal generated from the transistor 1, but passes the 2N-th harmonic frequency signal.

Next, the operation will be described.

As described above, since the transistor 1 is an active element having nonlinear characteristics, it generates, when oscillating at the oscillation frequency $F_0$, the 2N-th harmonic frequency signal of frequency $2N \cdot F_0$, which is one of the harmonics, besides the oscillation frequency signal of oscillation frequency $F_0$.

Here, as in the foregoing embodiment 1, since the open-ended stub 4 with a line length equal to a quarter of the wavelength of the 2N-th harmonic frequency signal generated from the transistor 1 is connected to the collector terminal of the transistor 1, the connecting point 5 between the collector terminal of the transistor 1 and the open-ended stub 4 becomes the short-circuiting point of the 2N-th harmonic frequency signal generated from the transistor 1. Thus, the 2N-th harmonic frequency signal undergoes total reflection.

Accordingly, the 2N-th harmonic frequency signal generated from the transistor 1 does not advance toward the output terminal 6 side so that only the oscillation frequency signal generated from the transistor 1 is output from the output terminal 6.

On the other hand, to the base terminal of the transistor 1, the resonator 31 with the high Q-value, which resonates at the oscillation frequency $F_0$ of the transistor 1, is connected.

In addition, the HPF 32 is connected to the resonator 31, and the connecting point between the resonator 31 and the HPF 32 is any given point in the resonator 31 except for the short-circuiting point of the frequency $2N \cdot F_0$, 2N times the oscillation frequency $F_0$.

Thus, the oscillation frequency signal and the 2N-th harmonic frequency signal which are generated from the transistor 1 are supplied to the HPF 32 via the connecting point of the resonator 31. In this connection, if the connecting point between the resonator 31 and the HPF 32 were the short-circuiting point of the frequency $2N \cdot F_0$, 2N times the oscillation frequency $F_0$ of the resonator 31, the 2N-th harmonic frequency signal would not be supplied to the HPF 32 from the connecting point of the resonator 31.

Receiving the oscillation frequency signal and the 2N-th harmonic frequency signal from the resonator 31, the HPF 32 stops the transit of the oscillation frequency signal, but passes the 2N-th harmonic frequency signal.

Thus, the oscillation frequency signal generated from the transistor 1 does not advance toward the output terminal 9 side so that only the 2N-th harmonic frequency signal, which passes through the HPF 32, is output from the output terminal 9.

As is clear from the foregoing description, the present embodiment 4 is configured in such a manner that the output terminal 6 for outputting the oscillation frequency signal generated from the transistor 1 is provided at the connecting point 5 between the collector terminal of the transistor 1 and the open-ended stub 4 by connecting the open-ended stub 4 with the line length equal to a quarter of the wavelength of the signal of frequency $2N \cdot F_0$ or 2N times the oscillation frequency $F_0$ to the collector terminal of the transistor 1; and that the resonator 31 is connected to the base terminal of the transistor 1, and the HPF 32 for stopping the transit of the oscillation frequency signal generated from the transistor 1 and for passing the 2N-th harmonic frequency signal is connected to the resonator 31. Thus, the present embodiment 4 can output the signal of oscillation frequency $F_0$ and the signal of frequency $2N \cdot F_0$, or 2N times the oscillation frequency $F_0$, without using the two active elements, thereby offering an advantage of being able to simplify and miniaturize the circuit configuration.

In addition, since the present embodiment 4 has the resonator 31 with the high Q-value connected to the base terminal of the transistor 1, it offers an advantage of being able to improve phase noise characteristics.

Incidentally, although the present embodiment 4 is described by way of example that connects the HPF 32 with the resonator 31, the filter is not limited to the HPF as long as the filter can stop the transit of the oscillation frequency signal generated from the transistor 1 and passes the 2N-th harmonic frequency signal. For example, a configuration is also possible which has a BPF (Band Pass Filter) or BRF (Band Rejection Filter) connected to the resonator 31, and it can offer the same advantage.

Embodiment 5

Although the foregoing embodiment 4 is described by way of example that connects the HPF 32 to any given point in the resonator 31 except for the short-circuiting point of the frequency $2N \cdot F_0$, 2N times the oscillation frequency $F_0$, the HPF 32 can be connected to an open point of the frequency $2N \cdot F_0$, 2N times the oscillation frequency $F_0$, in the resonator 31.

In this case, the reflection of the 2N-th harmonic frequency signal from the connecting point between the resonator 31 and the HPF 32 can be suppressed. Accordingly, the present embodiment 5 offers an advantage of being able to increase the power of the 2N-th harmonic frequency signal output from the output terminal 9.

Embodiment 6

Figure 6:
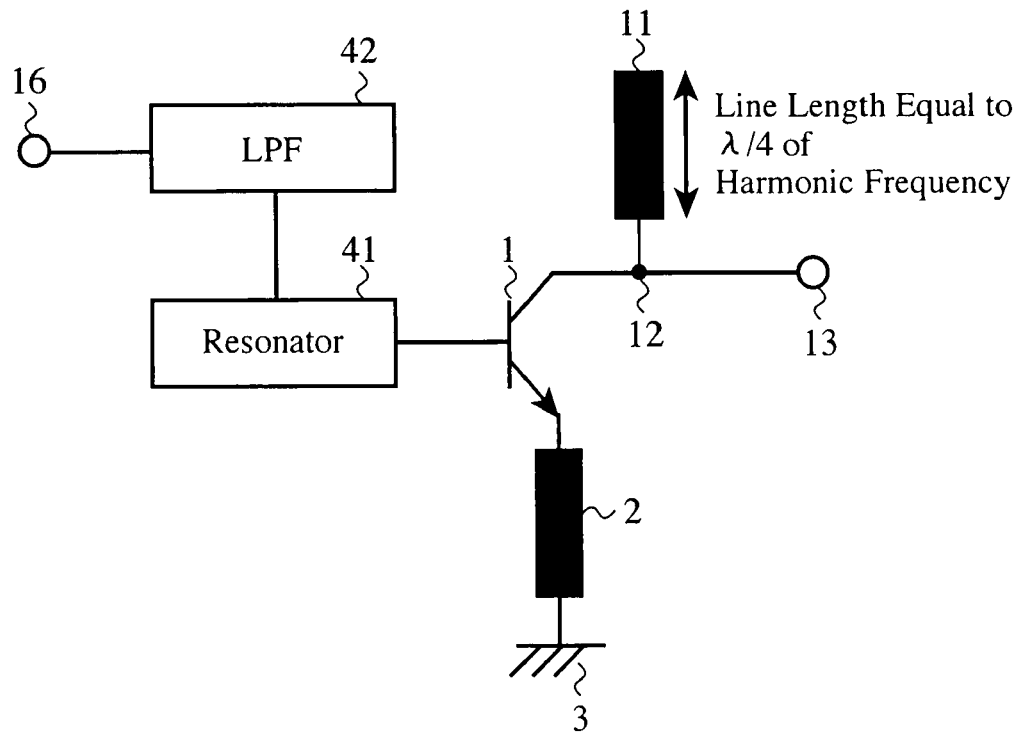
FIG. 6 is a block diagram showing an oscillator of an embodiment 6 in accordance with the present invention.

FIG. 6 is a circuit diagram showing an oscillator of an embodiment 6 in accordance with the present invention. In FIG. 6, since the same reference numerals as those of FIG. 2 designate the same or like portions, their description will be omitted.

A resonator 41, which is composed of an inductor and a capacitor connected in parallel, for example, is connected to the base terminal of the transistor 1. The resonator 41 has a high Q-value and resonates at the oscillation frequency $F_0$ of the transistor 1.

A LPF (Low-Pass Filter) 42 is connected to any given point of the resonator 41 except for the short-circuiting point of the oscillation frequency $F_0$. The LPF 42 is a filter that blocks the 2N-th harmonic frequency signal generated from the transistor 1, but passes the oscillation frequency signal.

Next, the operation will be described.

As described above, since the transistor 1 is an active element having nonlinear characteristics, it generates, when oscillating at the oscillation frequency $F_0$, the 2N-th harmonic frequency signal of frequency $2N \cdot F_0$, which is one of the harmonics, besides the oscillation frequency signal of oscillation frequency $F_0$.

Here, as in the foregoing embodiment 2, since the open-ended stub 11 with a line length equal to a quarter of the wavelength of the oscillation frequency signal generated from the transistor 1 is connected to the collector terminal of the transistor 1, the connecting point 12 between the collector terminal of the transistor 1 and the open-ended stub 11 becomes the short-circuiting point of the oscillation frequency signal generated from the transistor 1. Thus, the oscillation frequency signal undergoes total reflection.

Accordingly, the oscillation frequency signal generated from the transistor 1 does not advance toward the output terminal 13 side so that only the 2N-th harmonic frequency signal generated from the transistor 1 is output from the output terminal 13.

On the other hand, to the base terminal of the transistor 1, the resonator 41 with the high Q-value, which resonates at the oscillation frequency $F_0$ of the transistor 1, is connected.

In addition, the LPF 42 is connected to the resonator 41, and the connecting point between the resonator 41 and the LPF 42 is any given point in the resonator 41 except for the short-circuiting point of the oscillation frequency $F_0$.

Thus, the oscillation frequency signal and the 2N-th harmonic frequency signal which are generated from the transistor 1 are supplied to the LPF 42 via the connecting point of the resonator 41. In this connection, if the connecting point between the resonator 41 and the LPF 42 were the short-circuiting point of the oscillation frequency $F_0$ in the resonator 41, the oscillation frequency signal would not be supplied to the LPF 42 from the connecting point of the resonator 41.

Receiving the oscillation frequency signal and the 2N-th harmonic frequency signal from the resonator 41, the LPF 42 stops the transit of the 2N-th harmonic frequency signal, but passes the oscillation frequency signal.

Thus, the 2N-th harmonic frequency signal generated from the transistor 1 does not advance toward the output terminal 16 side so that only the oscillation frequency signal, which passes through the LPF 42, is output from the output terminal 16.

As is clear from the foregoing description, the present embodiment 6 is configured in such a manner that the output terminal 13 for outputting the 2N-th harmonic frequency signal generated from the transistor 1 is provided at the connecting point 12 between the collector terminal of the transistor 1 and the open-ended stub 11 by connecting the open-ended stub 11 with the line length equal to a quarter of the wavelength of the oscillation frequency $F_0$ to the collector terminal of the transistor 1; and that the resonator 41 is connected to the base terminal of the transistor 1, and the LPF 42 for stopping the transit of the 2N-th harmonic frequency signal generated from the transistor 1 and for passing the oscillation frequency signal is connected to the resonator 41. Thus, the present embodiment 6 can output the signal of oscillation frequency $F_0$ and the signal of frequency $2N \cdot F_0$, or 2N times the oscillation frequency $F_0$, without using the two active elements, thereby offering an advantage of being able to simplify and miniaturize the circuit configuration.

In addition, since the present embodiment 6 has the resonator 41 with the high Q-value connected to the base terminal of the transistor 1, it offers an advantage of being able to improve phase noise characteristics.

Incidentally, although the present embodiment 6 is described by way of example that connects the LPF 42 with the resonator 41, the filter is not limited to the LPF as long as it can stop the transit of the 2N-th harmonic frequency signal generated from the transistor 1 and passes the oscillation frequency signal. For example, a configuration is also possible which has a BPF or BRF connected to the resonator 41, and it can offer the same advantage.

Embodiment 7

Although the foregoing embodiment 6 is described by way of example that connects the LPF 42 to any given point in the resonator 41 except for the short-circuiting point of the oscillation frequency $F_0$, the LPF 42 can be connected to an open point of the oscillation frequency $F_0$ in the resonator 41.

In this case, the reflection of the oscillation frequency signal from the connecting point between the resonator 41 and the LPF 42 can be suppressed. Accordingly, the present embodiment 7 offers an advantage of being able to increase the power of the oscillation frequency signal output from the output terminal 16.

Embodiment 8

Figure 7:
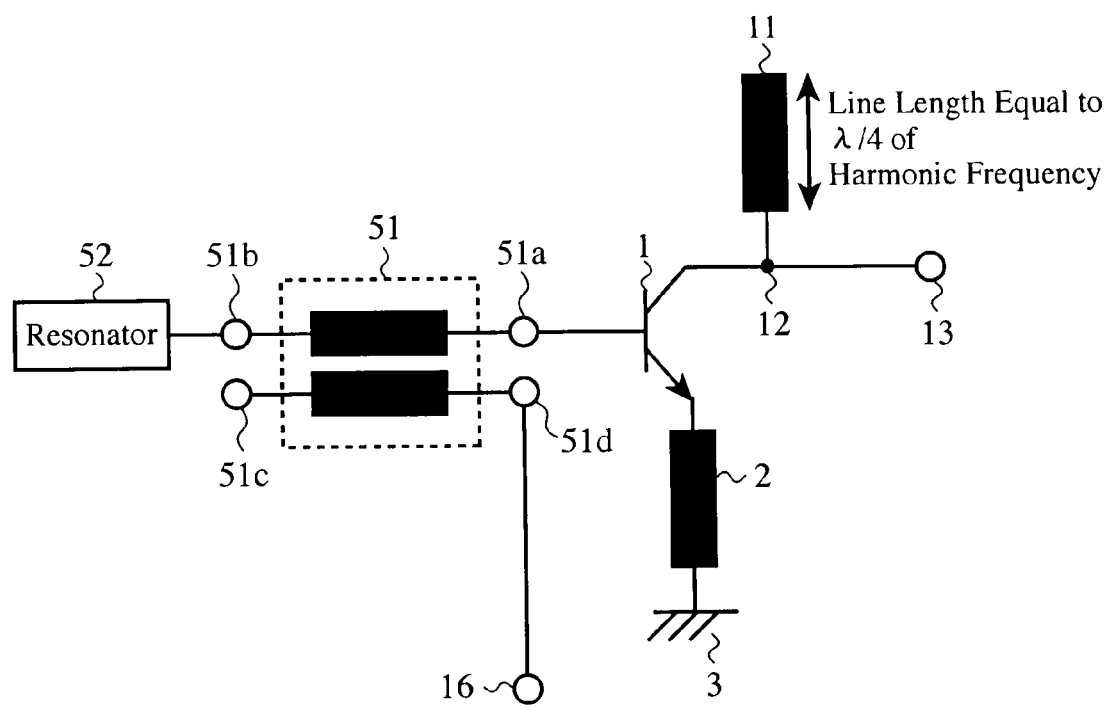
FIG. 7 is a circuit diagram showing an oscillator of an embodiment 8 in accordance with the present invention.

FIG. 7 is a circuit diagram showing an oscillator of an embodiment 8 in accordance with the present invention. In FIG. 7, since the same reference numerals as those of FIG. 1 designate the same or like portions, their description will be omitted.

A directional coupler 51 has an input terminal 51a, a through terminal 51b, an isolation terminal 51c and a coupled terminal 51d. The input terminal 51a is connected to the base terminal of the transistor 1, and the through terminal 51b is connected to a resonator 52.

The directional coupler 51 outputs, within a range of maintaining the oscillation at the oscillation frequency $F_0$, part of the power of the oscillation frequency signal input from the input terminal 51a to the coupled terminal 51d, but stops the transit of the 2N-th harmonic frequency signal input from the input terminal 51a to the coupled terminal 51d.

Figure 8:
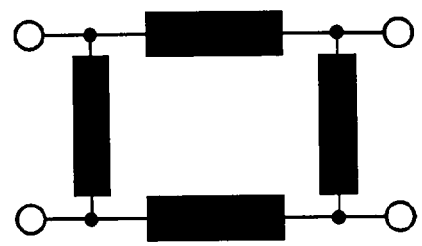
FIG. 8 is a circuit diagram showing a directional coupler (branch line coupler) of the oscillator of the embodiment 8 in accordance with the present invention.

Although FIG. 7 shows an example employing coupled lines as the directional coupler 51, a branch line coupler as shown in FIG. 8 can also be used in place of the coupled lines.

The resonator 52, which is composed of an inductor and a capacitor connected in parallel, for example, is connected to the through terminal 51b of the directional coupler 51. The resonator 52 has a high Q-value, and resonates at the oscillation frequency $F_0$ of the transistor 1.

Although FIG. 7 shows an example in which the isolation terminal 51c of the directional coupler 51 is not connected to any and is opened, the impedance at the isolation terminal 51c can take any given value.

Next, the operation will be described.

As described above, since the transistor 1 is an active element having nonlinear characteristics, it generates, when oscillating at the oscillation frequency $F_0$, the 2N-th harmonic frequency signal of frequency $2N \cdot F_0$, which is one of the harmonics, besides the oscillation frequency signal of oscillation frequency $F_0$.

Here, as in the foregoing embodiment 2, since the open-ended stub 11 with a line length equal to a quarter of the wavelength of the oscillation frequency signal generated from the transistor 1 is connected to the collector terminal of the transistor 1, the connecting point 12 between the collector terminal of the transistor 1 and the open-ended stub 11 becomes the short-circuiting point of the oscillation frequency signal generated from the transistor 1. Thus, the oscillation frequency signal undergoes the total reflection.

Accordingly, the oscillation frequency signal generated from the transistor 1 does not advance toward the output terminal 13 side so that only the 2N-th harmonic frequency signal generated from the transistor 1 is output from the output terminal 13.

On the other hand, to the base terminal of the transistor 1, the directional coupler 51 is connected which outputs, within the range of maintaining the oscillation at the oscillation frequency $F_0$, part of the power of the oscillation frequency signal input from the input terminal 51a to the coupled terminal 51d, but stops the transit of the 2N-th harmonic frequency signal input from the input terminal 51a to the coupled terminal 51d.

In addition, to the through terminal 51b of the directional coupler 51, the resonator 52 with the high Q-value, which resonates at the oscillation frequency $F_0$ of the transistor 1, is connected.

Thus, the 2N-th harmonic frequency signal generated from the transistor 1 does not advance toward the output terminal 16 side, and only the oscillation frequency signal generated from the transistor 1 is output from the output terminal 16.

As is clear from the foregoing description, the present embodiment 8 is configured in such a manner that the output terminal 13 for outputting the 2N-th harmonic frequency signal generated from the transistor 1 is provided at the connecting point 12 between the collector terminal of the transistor 1 and the open-ended stub 11 by connecting the open-ended stub 11 with the line length equal to a quarter of the wavelength of the oscillation frequency signal $F_0$ to the collector terminal of the transistor 1; and that the resonator 52 is connected to the through terminal 51b of the directional coupler 51 by connecting the directional coupler 51 to the base terminal of the transistor 1, which directional coupler 51 outputs, within the range of maintaining the oscillation at the oscillation frequency $F_0$, part of the power of the oscillation frequency signal input from the input terminal 51a to the coupled terminal 51d, but stops the transit of the 2N-th harmonic frequency signal input from the input terminal 51a to the coupled terminal 51d. Thus, the present embodiment 8 can output the signal of oscillation frequency $F_0$ and the signal of frequency $2N \cdot F_0$, or 2N times the oscillation frequency $F_0$, without using the two active elements, thereby offering an advantage of being able to simplify and miniaturize the circuit configuration.

In addition, since the present embodiment 8 is configured in such a manner as to connect the high Q-value resonator 52 to the through terminal 51b of the directional coupler 51, it offers an advantage of being able to improve the phase noise characteristics.

Embodiment 9

Figure 9:
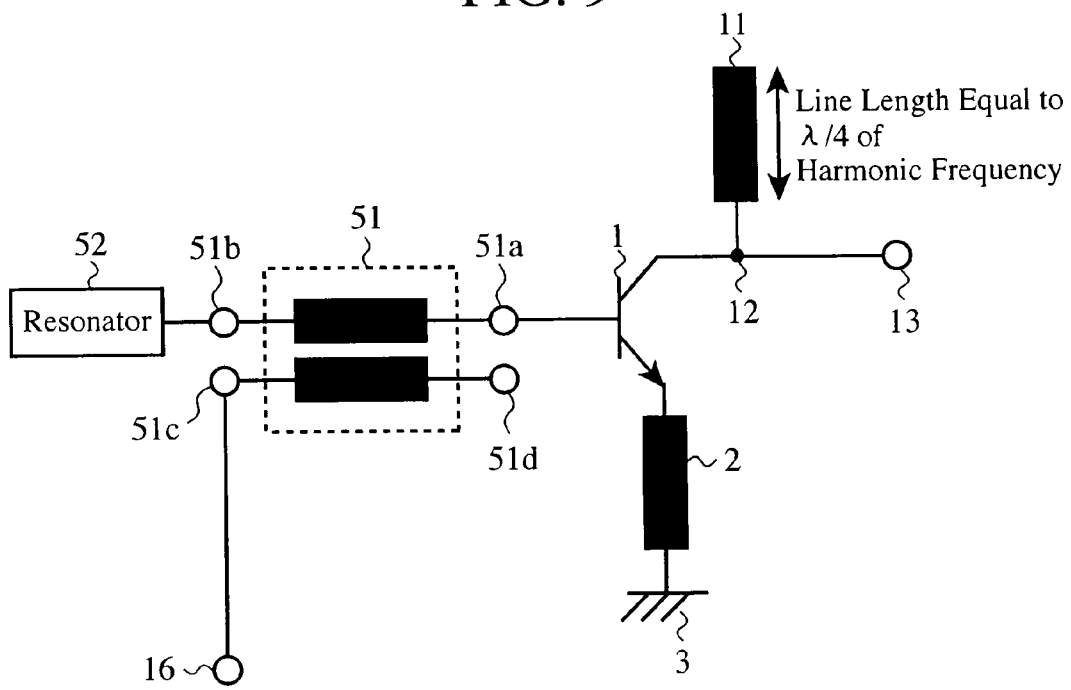
FIG. 9 is a circuit diagram showing an oscillator of an embodiment 9 in accordance with the present invention.

FIG. 9 is a circuit diagram showing an oscillator of an embodiment 9 in accordance with the present invention. In FIG. 9, since the same reference numerals as those of FIG. 7 designate the same or like portions, their description will be omitted.

Although the foregoing embodiment 8 is described by way of example that connects the output terminal 16 to the coupled terminal 51d of the directional coupler 51, the output terminal 16 can be connected to the isolation terminal 51c of the directional coupler 51 as shown in FIG. 9.

Next, the operation will be described.

Since a loss in the oscillation frequency signal of the resonator 52 is small, most of the power of the oscillation frequency signal, which is output from the through terminal 51b of the directional coupler 51 and is input to the resonator 52, returns to the through terminal 51b of the directional coupler 51, and is input to the directional coupler 51 again.

In this case, part of the power of the oscillation frequency signal input from the through terminal 51b is output from the isolation terminal 51c of the directional coupler 51.

Accordingly, the oscillation frequency signal is output from the output terminal 16 connected to the isolation terminal 51c of the directional coupler 51.

Although FIG. 9 shows an example in which the coupled terminal 51d is not connected to any and is opened, the impedance at the coupled terminal 51d can take any given value.

Embodiment 10

Figure 10:
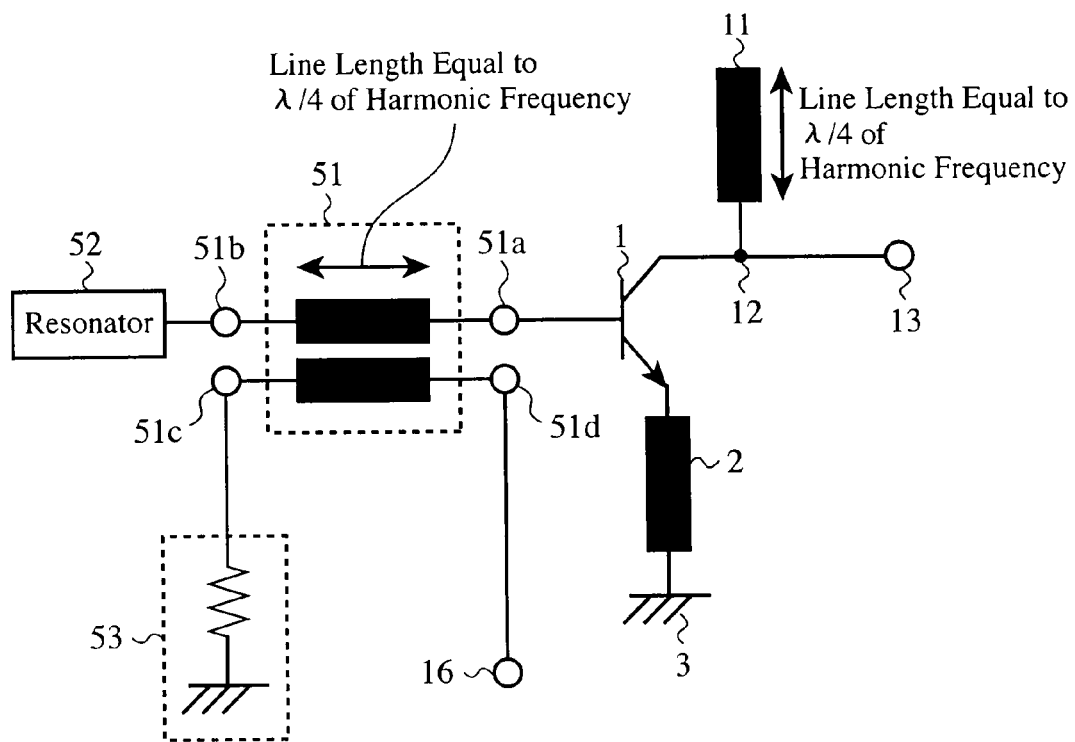
FIG. 10 is a circuit diagram showing an oscillator of an embodiment 10 in accordance with the present invention.
Figure 11:
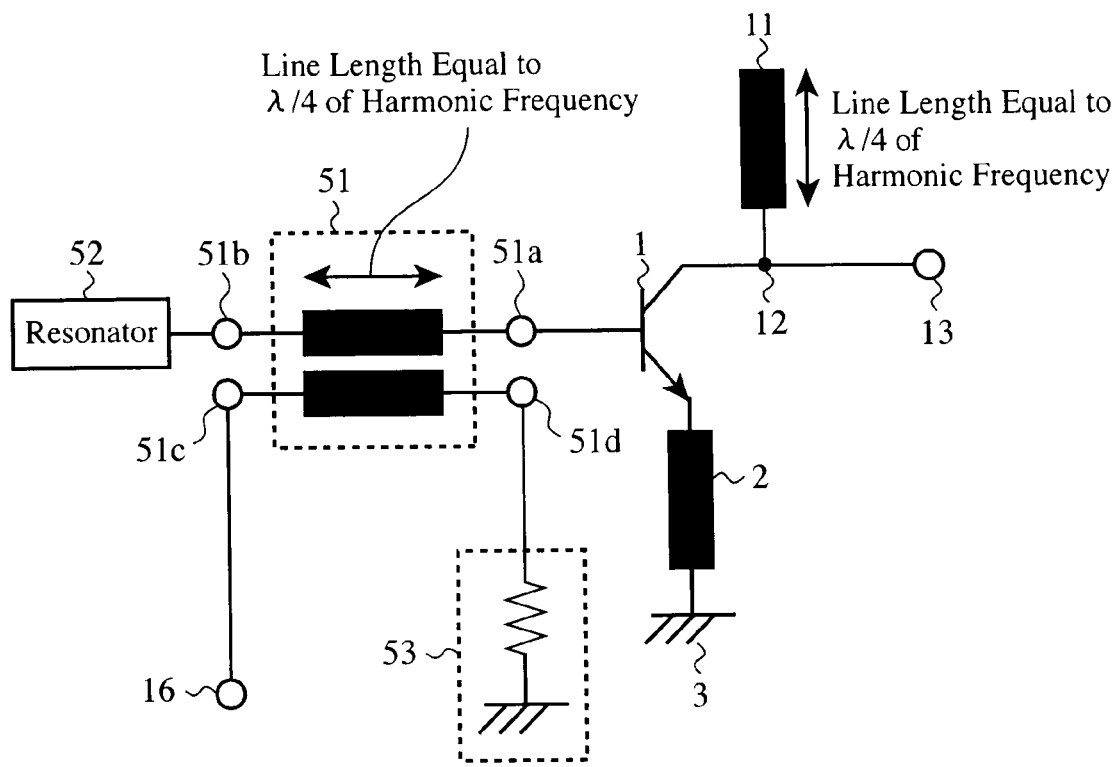
FIG. 11 is a circuit diagram showing an oscillator of the embodiment 10 in accordance with the present invention.

Although the foregoing embodiments 8 and 9 are described byway of example that opens the isolation terminal 51c or coupled terminal 51d of the directional coupler 51, this is not essential. For example, as shown in FIG. 10 and FIG. 11, a configuration is also possible which uses, as the directional coupler 51, coupled lines with the line length equal to a quarter of the wavelength of the oscillation frequency signal $F_0$, and which connects a reflection-free terminator 53 to the isolation terminal Sic or the coupled terminal 51d of the directional coupler 51.

In this case, even if the reflection phase characteristics of the resonator 52 vary, the coupling factor of the directional coupler 51 is kept constant. Accordingly, the present embodiment 10 offers an advantage of being able to maintain the constant power of the oscillation frequency signal output from the output terminal 16 regardless of the reflection phase characteristics of the resonator 52.

Embodiment 11

Figure 12:
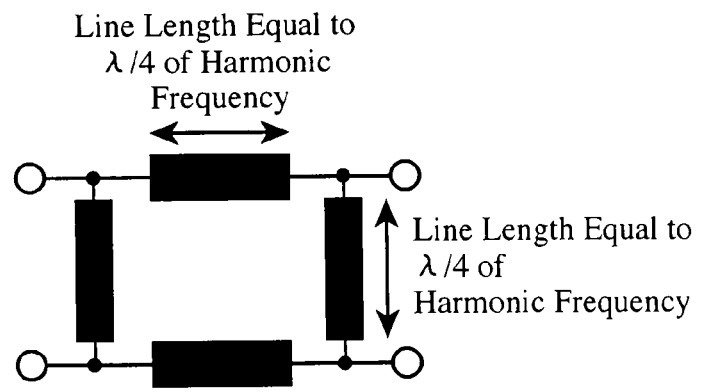
FIG. 12 is a circuit diagram showing a directional coupler (branch line coupler having a line length equal to a quarter of the wavelength of the oscillation frequency signal) of an oscillator of an embodiment 11 in accordance with the present invention.

Although the foregoing embodiment 10 is described by way of example that employs as the directional coupler 51 the coupled lines with the line length equal to a quarter of the wavelength of the oscillation frequency signal $F_0$, this is not essential. For example, as shown in FIG. 12, a branch line coupler with the line length equal to a quarter of the wavelength of the oscillation frequency signal $F_0$ can be used as the directional coupler 51.

In this case also, as in the case of the foregoing embodiment 10, although the reflection phase characteristics of the resonator 52 vary, the coupling factor of the directional coupler 51 is kept constant. This offers an advantage of being able to maintain the constant power of the oscillation frequency signal output from the output terminal 16 regardless of the reflection phase characteristics of the resonator 52.

Embodiment 12

Although the foregoing embodiments 8-11 handle the oscillators that connect the output terminal 16 for outputting the oscillation frequency signal to one of the coupled terminal 51d and isolation terminal 51c of the directional coupler 51, this is not essential. For example, as shown the FIG. 13, in addition to the output terminal 16, an output terminal 54 (third output terminal) for outputting the oscillation frequency signal can be connected to the terminal to which the output terminal 16 is not connected (isolation terminal 51c or coupled terminal 51d).

In this case, the oscillation frequency signal can be output from the output terminals 16 and 54.

Therefore, as in the foregoing embodiments 8-11, the present embodiment 12 offers an advantage of being able to output the signal of oscillation frequency $F_0$ and the signal of frequency $(2N)F_0$ or 2N times the oscillation frequency $F_0$, which are synchronized with each other.

Embodiment 13

FIG. 14 is a block diagram showing an oscillator of an embodiment 13 in accordance with the present invention. In FIG. 14, since the same reference numerals as those of FIG. 7 designate the same or like portions, their description will be omitted.

A phase shifter 55, which is connected to the isolation terminal 51c of the directional coupler 51, adjusts the phase of the oscillation frequency signal output from the isolation terminal 51c to the phase of the oscillation frequency signal output from the coupled terminal 51d of the directional coupler 51 to reduce the phase difference between the two oscillation frequency signals to zero.

Although FIG. 14 shows an example that connects the phase shifter 55 to the isolation terminal 51c of the directional coupler 51, it is also possible to connect the phase shifter 55 to the coupled terminal 51d of the directional coupler 51 to adjust the phase of the oscillation frequency signal output from the coupled terminal 51d to the phase of the oscillation frequency signal output from the isolation terminal 51c of the directional coupler 51 to reduce the phase difference between the two oscillation frequency signals to zero.

A power combiner 56 combines the power of the two oscillation frequency signals whose phases are matched by the phase shifter 55.

Next, the operation will be described.

The phase shifter 55 adjusts the phase of the oscillation frequency signal output from the isolation terminal Sic of the directional coupler 51 to the phase of the oscillation frequency signal output from the coupled terminal 51d of the directional coupler 51 to reduce the phase difference between the two oscillation frequency signals to zero.

When the phase shifter 55 reduces the phase difference between the oscillation frequency signal output from the isolation terminal 51c and the oscillation frequency signal output from the coupled terminal 51d of the directional coupler 51 to zero, the power combiner 56 combines the power of the two oscillation frequency signals, and outputs the oscillation frequency signal after combining to the output terminal 16.

This offers an advantage of being able to increase the power of the oscillation frequency signal.

Embodiment 14

Figure 15:
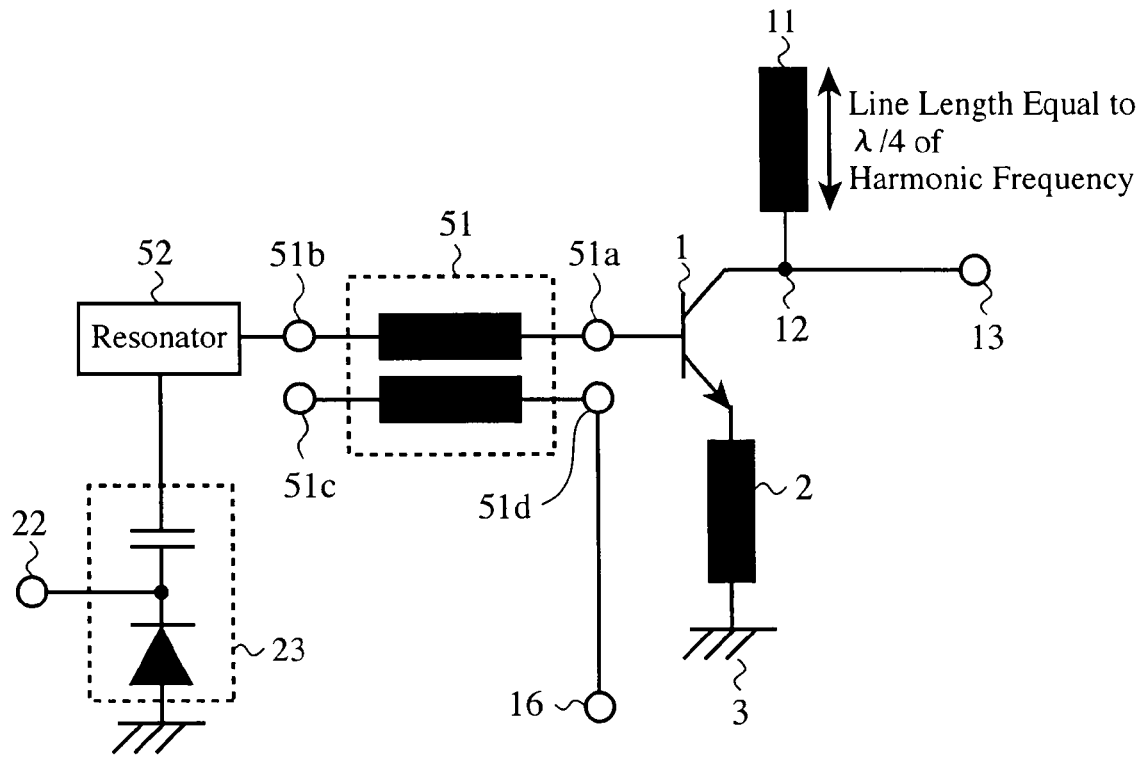
FIG. 15 is a circuit diagram showing an oscillator of an embodiment 14 in accordance with the present invention.

Although the foregoing embodiments 4-13 do not mention specifically, the varactor diode 23 whose capacitance varies in accordance with the external voltage input from the input terminal 22 can be connected to the resonator 52 as shown in FIG. 15.

This offers an advantage of being able to set the oscillation frequency $F_0$ to any desired frequency as in the foregoing embodiment 3.

Although the example that applies the varactor diode 23 to the resonator of FIG. 7 is described here, the varactor diode 23 is also applicable to any one of the resonators of FIG. 5, FIG. 6, FIG. 9, FIG. 10, FIG. 11, FIG. 13 and FIG. 14.

Embodiment 15

Figure 16:
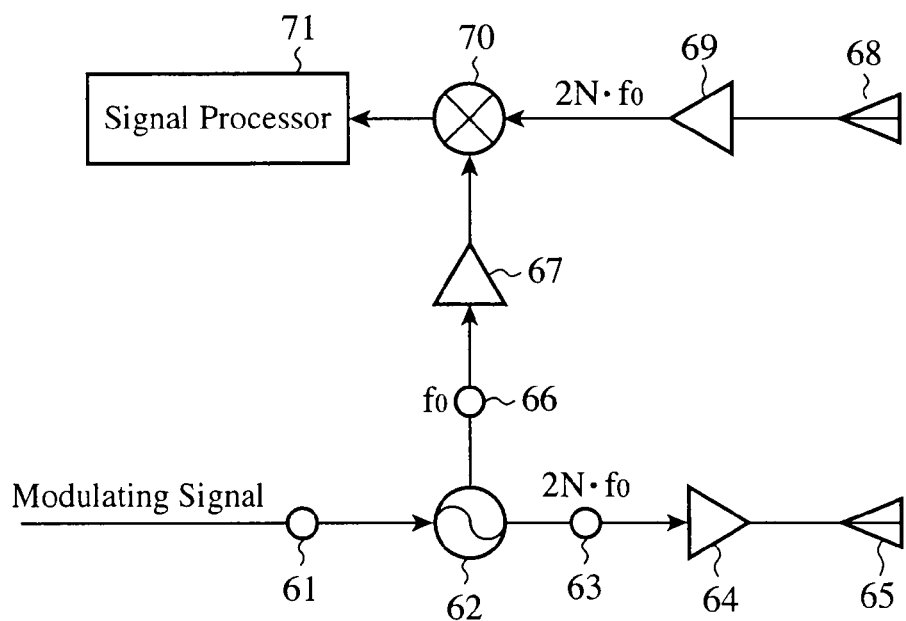
FIG. 16 is a block diagram showing a transmitter-receiver of an embodiment 15 in accordance with the present invention.

FIG. 16 is a block diagram showing a transmitter-receiver of an in embodiment 15 accordance with the present invention. In FIG. 16, a tuning voltage terminal 61 is a terminal to which a modulating signal is input.

An oscillator 62, which is an oscillator of FIG. 15 or the oscillator of FIG. 5, FIG. 6, FIG. 9, FIG. 10, FIG. 11, FIG. 13 or FIG. 14 where the varactor diode 23 is applied to the resonator 31, 41 or 52, has the input terminal 22 connected to the tuning voltage terminal 61 so that the oscillation frequency $F_0$ is set in accordance with the modulating signal input from the input terminal 22.

An output terminal 63 is a terminal for outputting the 2N-th harmonic frequency signal of frequency $2N \cdot F_0$ output from the oscillator 62.

An output amplifier 64 amplifies the power of the 2N-th harmonic frequency signal of frequency $2N \cdot F_0$ output from the output terminal 63.

A transmitting antenna 65 transmits the 2N-th harmonic frequency signal whose power is amplified through the output amplifier 64.

An output terminal 66 is a terminal for outputting the oscillation frequency signal of frequency $F_0$ output from the oscillator 62.

An output amplifier 67 amplifies the power of the oscillation frequency signal of frequency $F_0$ output from the output terminal 66, and outputs the oscillation frequency signal after the amplification to a mixer 70 as a local oscillator signal.

A receiving antenna 68 receives the 2N-th harmonic frequency signal of frequency $2N \cdot F_0$.

A low-noise amplifier 69 amplifies the power of the 2N-th harmonic frequency signal received by the receiving antenna 68.

The mixer 70 mixes the 2N-th harmonic frequency signal whose power is amplified by the low-noise amplifier 69 with the local oscillator signal output from the output amplifier 67.

A signal processor 71 performs signal processing (such as demodulating processing or decoding processing of the signal) on the signal mixed by the mixer 70.

Figure 17:
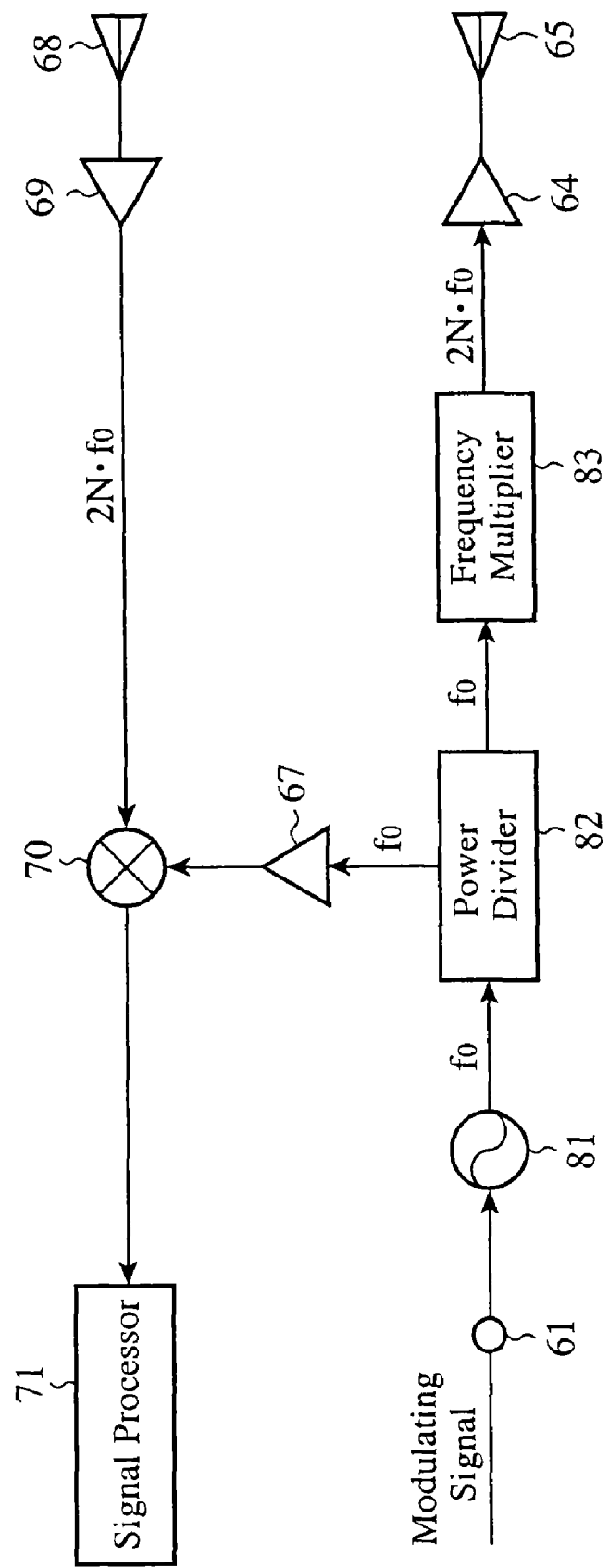
FIG. 17 is a block diagram showing a conventional transmitter-receiver.

FIG. 17 is a block diagram showing a conventional transmitter-receiver. In FIG. 17, since the same reference numerals as those of FIG. 16 designate the same or like portions, their description will be omitted.

An oscillator 81 generates the oscillation frequency signal of frequency $F_0$.

A power divider 82 divides the power of the oscillation frequency signal generated from the oscillator 81 into two parts.

A frequency multiplier 83 multiplies a first part of the oscillation frequency signal divided by the power divider 82, and outputs the 2N-th harmonic frequency signal.

Comparing the transmitter-receiver of FIG. 16 of the present embodiment 15 with the conventional transmitter-receiver of FIG. 17, the transmitter-receiver of FIG. 16 differs in that it employs the oscillator 62 instead of the oscillator 81, power divider 82 and frequency multiplier 83.

Using the oscillator 62 can obviate the necessity for the power divider 82 and frequency multiplier 83. Accordingly, the present embodiment 15 contributes to the simplification of the configuration of the transmitter-receiver and to the reduction in size and cost thereof.

In addition, since the frequency multiplier 83, output amplifiers 64 and 67 and low-noise amplifier 69 are active devices using transistors in the conventional transmitter-receiver, their characteristics vary with changes in temperature and output load. In the transmitter-receiver of FIG. 16, however, since the frequency multiplier 83 becomes unnecessary, the present embodiment offers an advantage of being able to reduce the variations in the characteristics of the transmitter-receiver due to the changes in temperature or output load.

Incidentally, although FIG. 16 shows a transmitter-receiver including the output amplifiers 64 and 67 and the low-noise amplifier 69, a configuration can also be possible which eliminates any of the output amplifiers 64 and 67 and the low-noise amplifier 69 or all of them.

In this case, it contributes to the simplification of the configuration of the transmitter-receiver and to the reduction in size and cost thereof. In addition, it offers an advantage of being able to reduce the variations in the characteristics of the transmitter-receiver due to the changes in temperature or output load.

Embodiment 16

Figure 18:
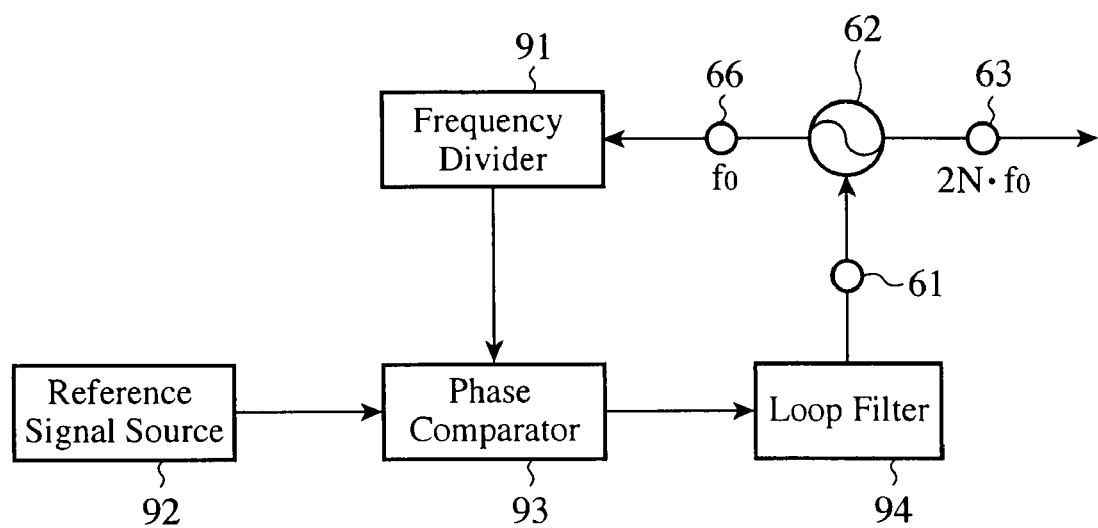
FIG. 18 is a block diagram showing a frequency synthesizer of an embodiment 16 in accordance with the present invention.

FIG. 18 is a block diagram showing a frequency synthesizer of an embodiment 16 in accordance with the present invention. In FIG. 18, since the same reference numerals as those of FIG. 16 designate the same or like portions, their description will be omitted.

A frequency divider 91 divides the frequency $F_0$ of the oscillation frequency signal output from the output terminal 66.

A reference signal source 92 generates a reference signal.

A phase comparator 93 compares the phase of the reference signal generated by the reference signal source 92 with the phase of the signal divided by the frequency divider 91, and outputs a phase comparison signal indicating a compared result of the phases.

A loop filter 94 smoothes the phase comparison signal output from the phase comparator 93 and supplies the phase comparison signal after smoothing to the tuning voltage terminal 61, thereby setting the oscillation frequency $F_0$ of the oscillator 62.

Figure 19:
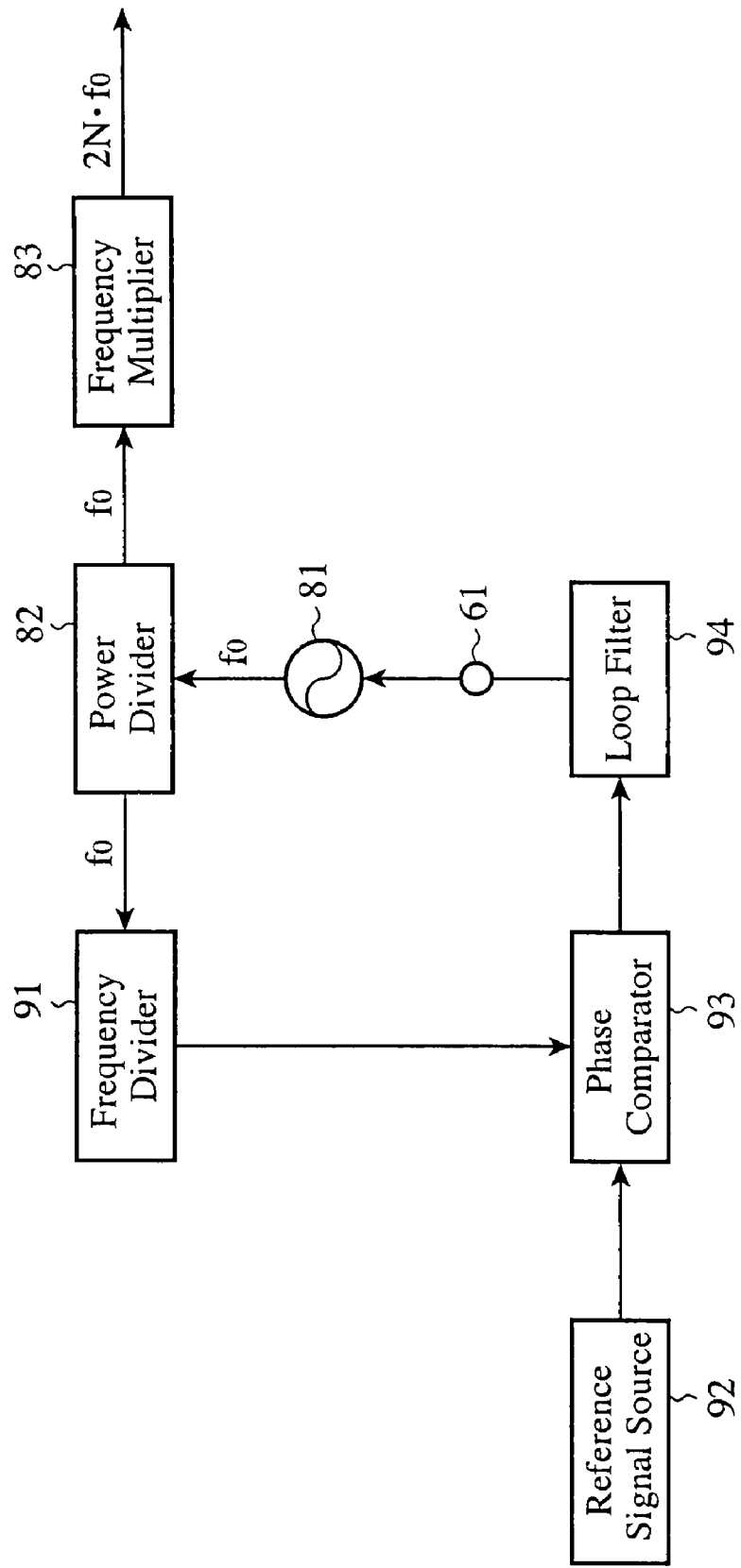
FIG. 19 is a block diagram showing a conventional frequency synthesizer.

FIG. 19 is a block diagram showing a conventional frequency synthesizer. In FIG. 19, since the same reference numerals as those of FIG. 17 and FIG. 18 designate the same or like portions, their description will be omitted.

Comparing the frequency synthesizer of FIG. 18 of the present embodiment 16 with the conventional frequency synthesizer of FIG. 19, the frequency synthesizer of FIG. 18 differs in that it employs the oscillator 62 instead of the oscillator 81, power divider 82 and frequency multiplier 83.

Using the oscillator 62 can obviate the necessity for the power divider 82 and frequency multiplier 83. Accordingly, the present embodiment 16 contributes to the simplification of the configuration of the frequency synthesizer and to the reduction in size and cost thereof.

In addition, in the conventional frequency synthesizer, since the frequency multiplier 83 is an active device using transistors, its characteristics vary with changes in temperature and output load. In the frequency synthesizer of FIG. 18, however, since the frequency multiplier 83 becomes unnecessary, the present embodiment 16 offers an advantage of being able to reduce the variations in the characteristics of the frequency synthesizer due to the changes in temperature or output load.

Embodiment 17

Figure 20:
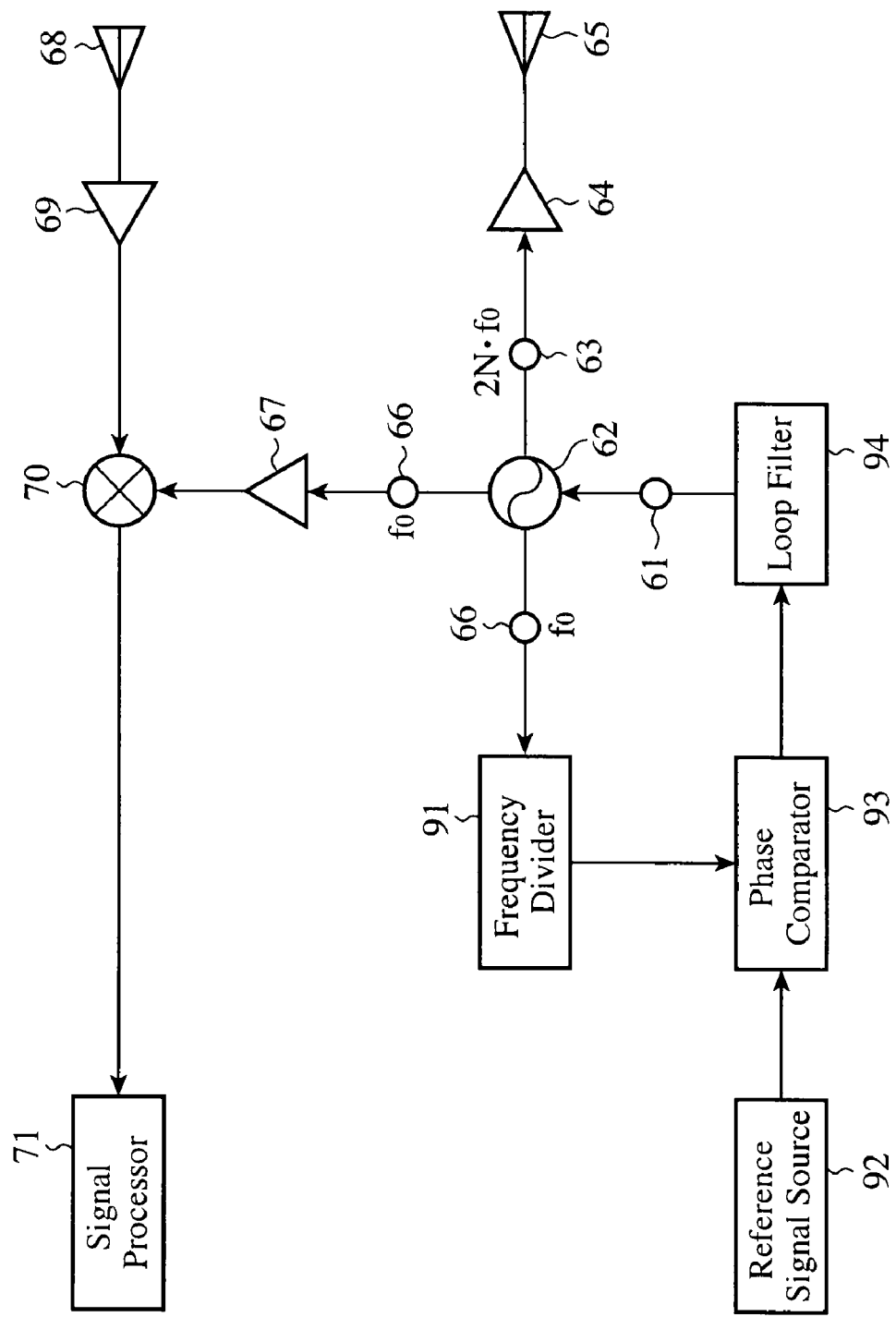
FIG. 20 is a block diagram showing a transmitter-receiver of an embodiment 17 in accordance with the present invention.

FIG. 20 is a block diagram showing a transmitter-receiver of an embodiment 17 in accordance with the present invention. In FIG. 20, since the same reference numerals as those of FIG. 16 and FIG. 18 designate the same or like portions, their description will be omitted.

Figure 21:
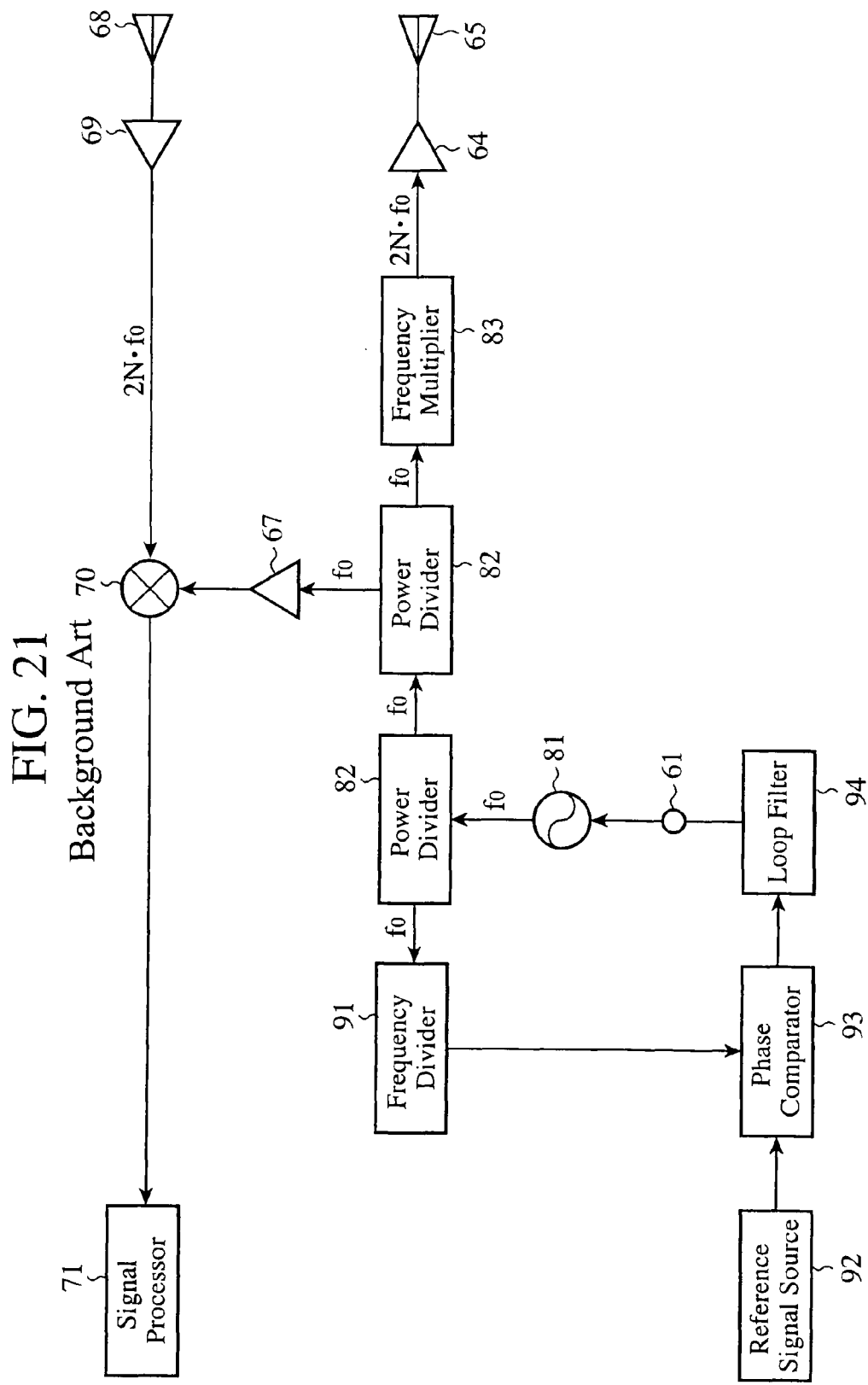
FIG. 21 is a block diagram showing a conventional transmitter-receiver.

FIG. 21 is a block diagram showing a conventional transmitter-receiver. In FIG. 21, since the same reference numerals as those of FIG. 17 and FIG. 19 designate the same or like portions, their description will be omitted.

Comparing the transmitter-receiver of FIG. 20 of the present embodiment 17 with the conventional transmitter-receiver of FIG. 21, the transmitter-receiver of FIG. 20 differs in that it employs the oscillator 62 instead of the oscillator 81, two power dividers 82 and frequency multiplier 83.

Using the oscillator 62 can obviate the necessity for the two power dividers 82 and frequency multiplier 83. Accordingly, the present embodiment 17 contributes to the simplification of the configuration of the transmitter-receiver and to the reduction in size and cost thereof.

In addition, in the conventional transmitter-receiver, since the frequency multiplier 83, output amplifiers 64 and 67 and low-noise amplifier 69 are active devices using transistors, their characteristics vary with changes in temperature or output load. In the transmitter-receiver of FIG. 20, however, since the frequency multiplier 83 becomes unnecessary, the present embodiment 17 offers an advantage of being able to reduce the variations in the characteristics of the transmitter-receiver due to the changes in temperature or output load.

Incidentally, although FIG. 20 shows a transmitter-receiver including the output amplifiers 64 and 67 and the low-noise amplifier 69, a configuration can also be possible which eliminates any of the output amplifiers 64 and 67 and the low-noise amplifier 69 or all of them.

In this case, it contributes to the simplification of the configuration of the transmitter-receiver and to the reduction in size and cost thereof. In addition, it offers an advantage of being able to reduce the variations in the characteristics of the transmitter-receiver due to the changes in temperature or output load.

INDUSTRIAL APPLICABILITY

As described above, the oscillator in accordance with the present invention can output the signal of frequency Fo and the signal of frequency 2N·Fo, and is suitable for application to a signal source of a communication system or radar system, for example.

What is claimed is:

1. An oscillator, comprising:
    an active element configured to oscillate at a designated oscillation frequency to generate a signal of the oscillation frequency and to generate a signal of a 2N-fold frequency of the oscillation frequency;
    an inductor connected between an emitter terminal of the active element and a ground;
    a first open-ended stub connected to a collector terminal of the active element and having a line length equal to a quarter of the wavelength of the signal of the 2N-fold frequency of the oscillation frequency;
    a first output terminal provided at a connecting point between the collector terminal of the active element and the first open-ended stub, to output the signal of the oscillation frequency generated by the active element;
a second open-ended stub connected to a base terminal of the active element and having a line length longer than a quarter of the wavelength of the signal of the oscillation frequency; and
a second output terminal provided at a position separated from an end of the second open-ended stub by a distance equal to a quarter of the wavelength of the signal of the oscillation frequency, to output the signal of the 2N-fold frequency of the oscillation frequency generated by the active element.

2. The oscillator according to claim 1, further comprising a capacitance-variable varactor diode connected to the second open-ended stub, to set the oscillation frequency of the active element.

3. An oscillator, comprising:
an active element configured to oscillate at a designated oscillation frequency to generate a signal of the oscillation frequency and to generate a signal of a 2N-fold frequency of the oscillation frequency;
an inductor connected between an emitter terminal of the active element and a ground;
a first open-ended stub connected to a collector terminal of the active element and having a line length equal to a quarter of the wavelength of the signal of the oscillation frequency;
a first output terminal provided at a connecting point between the collector terminal of the active element and the first open-ended stub, to output the signal of the 2N-fold frequency of the oscillation frequency generated by the active element;
a second open-ended stub connected to a base terminal of the active element and having a line length longer than a quarter of the wavelength of the signal of the 2N-fold frequency of the oscillation frequency; and
a second output terminal provided at a position separated from an end of the second open-ended stub by a distance equal to a quarter of the wavelength of the signal of the 2N-fold frequency of the oscillation frequency, to output the signal of the oscillation frequency generated by the active element.

4. The oscillator according to claim 3, further comprising a capacitance-variable varactor diode connected to the second open-ended stub, to set the oscillation frequency of the active element.

5. An oscillator, comprising: an active element configured to oscillate at a designated oscillation frequency to generate a signal of the oscillation frequency and to generate a signal of a 2N-fold frequency of the oscillation frequency; an inductor connected between an emitter terminal of the active element and a ground; an open-ended stub connected to a collector terminal of the active element and having a line length equal to a quarter of the wavelength of the signal of the 2N-fold frequency of the oscillation frequency; a first output terminal provided at a connecting point between the collector terminal of the active element and the open-ended stub, to output the signal of the oscillation frequency generated by the active element; a resonator connected to a base terminal of the active element and configured to resonate at the oscillation frequency; a filter connected to any given point except for a short-circuiting point of the 2N-fold frequency of the oscillation frequency in the resonator, to stop transit of the signal of the oscillation frequency generated by the active element and to pass the signal of the 2N-fold frequency of the oscillation frequency; and a second output terminal to output the signal of the 2N-fold frequency of the oscillation frequency, which is a transit signal of the filter.

6. The oscillator according to claim 5, further comprising a capacitance-variable varactor diode connected to the resonator, to set the oscillation frequency of the active element.

7. The oscillator according to claim 5, wherein the filter is connected to an open point of the 2N-fold frequency of the oscillation frequency in the resonator.

8. An oscillator, comprising: an active element configured to oscillate at a designated oscillation frequency to generate a signal of the oscillation frequency and to generate a signal of a 2N-fold frequency of the oscillation frequency; an inductor connected between an emitter terminal of the active element and a ground; an open-ended stub connected to a collector terminal of the active element and having a line length equal to a quarter of the wavelength of the signal of the oscillation frequency; a first output terminal provided at a connecting point between the collector terminal of the active element and the open-ended stub, to output the signal of the 2N-fold frequency of the oscillation frequency generated by the active element; a resonator connected to a base terminal of the active element and configured to resonate at the oscillation frequency; a filter connected to any given point except for a short-circuiting point of the oscillation frequency in the resonator, to stop transit of the signal of the 2N-fold frequency of the oscillation frequency generated by the active element and to pass the signal of the oscillation frequency; and a second output terminal to output the signal of the oscillation frequency, which is a transit signal of the filter.

9. The oscillator according to claim 8, further comprising a capacitance-variable varactor diode connected to the resonator, to set the oscillation frequency of the active element.

10. The oscillator according to claim 8, wherein the filter is connected to an open point of the oscillation frequency of the resonator.

11. An oscillator, comprising:
an active element configured to oscillate at a designated oscillation frequency to generate a signal of the oscillation frequency and to generate a signal of a 2N-fold frequency of the oscillation frequency;
an inductor connected between an emitter terminal of the active element and a ground;
an open-ended stub connected to a collector terminal of the active element and having a line length equal to a quarter of the wavelength of the signal of the oscillation frequency;
a first output terminal provided at a connecting point between the collector terminal of the active element and the open-ended stub, to output the signal of the 2N-fold frequency of the oscillation frequency generated by the active element;
a directional coupler having an input terminal connected to a base terminal of the active element, to input the signal of the oscillation frequency generated by the active element from the input terminal, wherein the directional coupler is configured to stop transit of the signal of the 2N-fold frequency of the oscillation frequency;
a resonator connected to a through terminal of the directional coupler and configured to resonate at the oscillation frequency; and
a second output terminal connected to a coupled terminal of the directional coupler, to output the signal of the oscillation frequency output from the coupled terminal.

12. The oscillator according to claim 11, further comprising a capacitance-variable varactor diode connected to the resonator, to set the oscillation frequency of the active element.

13. The oscillator according to claim 11, using as the directional coupler a coupled line or branch line coupler having a line length equal to a quarter of the wavelength of the signal of the oscillation frequency, wherein the directional coupler has an isolation terminal connected to a reflection-free terminator.

14. An oscillator, comprising:
an active element configured to oscillate at a designated oscillation frequency to generate a signal of the oscillation frequency and to generate a signal of a 2N-fold frequency of the oscillation frequency;
an inductor connected between an emitter terminal of the active element and a ground;
an open-ended stub connected to a collector terminal of the active element and having a line length equal to a quarter of the wavelength of the signal of the oscillation frequency;
a first output terminal provided at a connecting point between the collector terminal of the active element and the open-ended stub, to output the signal of the 2N-fold frequency of the oscillation frequency generated by the active element;
a directional coupler having an input terminal connected to a base terminal of the active element, to input the signal of the oscillation frequency generated by the active element from the input terminal, wherein the directional coupler is configured to stop transit of the signal of the 2N-fold frequency of the oscillation frequency;
a resonator connected to a through terminal of the directional coupler and configured to resonate at the oscillation frequency; and
a second output terminal connected to an isolation terminal of the directional coupler, to output the signal of the oscillation frequency output from the isolation terminal.

15. The oscillator according to claim 14, further comprising a capacitance-variable varactor diode connected to the resonator, to set the oscillation frequency of the active element.

16. The oscillator according to claim 14, using as the directional coupler a coupled line or branch line coupler having a line length equal to a quarter of the wavelength of the signal of the oscillation frequency, wherein the directional coupler has a coupled terminal connected to a reflection-free terminator.

17. An oscillator, comprising:
an active element configured to oscillate at a designated oscillation frequency to generate a signal of the oscillation frequency and to generate a signal of a 2N-fold frequency of the oscillation frequency;
an inductor connected between an emitter terminal of the active element and a ground;
an open-ended stub connected to a collector terminal of the active element and having a line length equal to a quarter of the wavelength of the signal of the oscillation frequency;
a first output terminal provided at a connecting point between the collector terminal of the active element and the open-ended stub, to output the signal of the 2N-fold frequency of the oscillation frequency generated by the active element;
a directional coupler having an input terminal connected to a base terminal of the active element, to input the signal of the oscillation frequency generated by the active element from the input terminal, wherein the directional coupler is configured to stop transit of the signal of the 2N-fold frequency of the oscillation frequency;
a resonator connected to a through terminal of the directional coupler and configured to resonate at the oscillation frequency;
a second output terminal connected to an isolation terminal of the directional coupler, to output the signal of the oscillation frequency output from the isolation terminal; and
a third output terminal connected to a coupled terminal of the directional coupler, to output the signal of the oscillation frequency output from the coupled terminal.

18. The oscillator according to claim 17, further comprising a capacitance-variable varactor diode connected to the resonator, to set the oscillation frequency of the active element.

19. An oscillator, comprising:
an active element configured to oscillate at a designated oscillation frequency to generate a signal of the oscillation frequency and to generate a signal of a 2N-fold frequency of the oscillation frequency;
an inductor connected between an emitter terminal of the active element and a ground;
an open-ended stub connected to a collector terminal of the active element and having a line length equal to a quarter of the wavelength of the signal of the oscillation frequency;
a first output terminal provided at a connecting point between the collector terminal of the active element and the open-ended stub, to output the signal of the 2N-fold frequency of the oscillation frequency generated by the active element;
a directional coupler having an input terminal connected to a base terminal of the active element, to input the signal of the oscillation frequency generated by the active element from the input terminal;
a resonator connected to a through terminal of the directional coupler and configured to resonate at the oscillation frequency;
a phase shifter to match a phase of the signal of the oscillation frequency output from an isolation terminal of the directional coupler to a phase of the signal of the oscillation frequency output from a coupled terminal of the directional coupler;
a power combiner to combine powers of the two signals of the oscillation frequency whose phases are matched by the phase shifter; and
a second output terminal to output the signal of the oscillation frequency passing through the power combining by the power combiner.

20. The oscillator according to claim 19, further comprising a capacitance-variable varactor diode connected to the resonator, to set the oscillation frequency of the active element.

21. A transmitter-receiver having an oscillator configured to output a signal of an oscillation frequency and a signal of a 2N-fold frequency of the oscillation frequency, a transmitting antenna configured to transmit the signal of the 2N-fold frequency of the oscillation frequency output from the oscillator, a receiving antenna configured to receive the signal of the 2N-fold frequency of the oscillation frequency, a mixer configured to mix the signal of the 2N-fold frequency of the oscillation frequency received by the receiving antenna with the signal of the oscillation frequency output from the oscillator, and a signal processor configured to perform signal processing on the signal mixed by the mixer, wherein the oscillator comprises:
a capacitance-variable varactor diode to set the oscillation frequency in accordance with a modulating signal;

an active element configured to oscillate at the oscillation frequency set by the varactor diode to generate the signal of the oscillation frequency and to generate the signal of the 2N-fold frequency of the oscillation frequency;

an inductor connected between an emitter terminal of the active element and a ground;

an open-ended stub connected to a collector terminal of the active element and having a line length equal to a quarter of the wavelength of the signal of the oscillation frequency;

a first output terminal provided at a connecting point between the collector terminal of the active element and the open-ended stub, to output the signal of the 2N-fold frequency of the oscillation frequency generated by the active element;

a directional coupler having an input terminal connected to a base terminal of the active element, to input the signal of the oscillation frequency generated by the active element from the input terminal, wherein the directional coupler is configured to stop transit of the signal of the 2N-fold frequency of the oscillation frequency;

a resonator connected to a through terminal of the directional coupler and configured to resonate at the oscillation frequency; and a second output terminal connected to a coupled terminal or isolation terminal of the directional coupler, to output the signal of the oscillation frequency output from the coupled terminal or isolation terminal.

22. A frequency synthesizer having an oscillator configured to output a signal of an oscillation frequency and a signal of a 2N-fold frequency of the oscillation frequency, a frequency divider configured to divide the frequency of the signal of the oscillation frequency output from the oscillator, a reference signal source configured to generate a reference signal, a phase comparator configured to compare a phase of the reference signal generated by the reference signal source with a phase of the signal whose frequency is divided by the frequency divider and configured to output a phase comparison signal indicating a phase comparison result, a loop filter for configured to smooth the phase comparison signal output from the phase comparator and to output the phase comparison signal after smoothing to the oscillator, wherein the oscillator comprises:

a capacitance-variable varactor diode to set the oscillation frequency in accordance with the phase comparison signal after smoothing which is output from the loop filter;

an active element configured to oscillate at the oscillation frequency set by the varactor diode to generate the signal of the oscillation frequency and to generate the signal of the 2N-fold frequency of the oscillation frequency;

an inductor connected between an emitter terminal of the active element and a ground;

an open-ended stub connected to a collector terminal of the active element and having a line length equal to a quarter of the wavelength of the signal of the oscillation frequency;

a first output terminal provided at a connecting point between the collector terminal of the active element and the open-ended stub, to output the signal of the 2N-fold frequency of the oscillation frequency generated by the active element;

a directional coupler having an input terminal connected to a base terminal of the active element, to input the signal of the oscillation frequency generated by the active element from the input terminal, wherein the directional coupler is configured to stop transit of the signal of the 2N-fold frequency of the oscillation frequency;

a resonator connected to a through terminal of the directional coupler and configured to resonate at the oscillation frequency; and a second output terminal connected to a coupled terminal or isolation terminal of the directional coupler, to output the signal of the oscillation frequency output from the coupled terminal or isolation terminal.

23. A transmitter-receiver having an oscillator configured to output a signal of an oscillation frequency and a signal of a 2N-fold frequency of the oscillation frequency, a transmitting antenna configured to transmit the signal of the 2N-fold frequency of the oscillation frequency output from the oscillator, a receiving antenna configured to receive the signal of the 2N-fold frequency of the oscillation frequency, a mixer configured to mix the signal of the 2N-fold frequency of the oscillation frequency received by the receiving antenna with the signal of the oscillation frequency output from the oscillator, a signal processor configured to perform signal processing on the signal mixed by the mixer, a frequency divider configured to divide the frequency of the signal of the oscillation frequency output from the oscillator, a reference signal source configured to generate a reference signal, a phase comparator configured to compare a phase of the reference signal generated by the reference signal source with a phase of the signal whose frequency is divided by the frequency divider and configured to output a phase comparison signal indicating a phase comparison result, a loop filter configured to smooth the phase comparison signal output from the phase comparator and to output the phase comparison signal after smoothing to the oscillator, wherein the oscillator comprises:

a capacitance-variable varactor diode to set the oscillation frequency in accordance with the phase comparison signal after smoothing, which is output from the loop filter;

an active element configured to oscillate at the oscillation frequency set by the varactor diode to generate the signal of the oscillation frequency and to generate the signal of the 2N-fold frequency of the oscillation frequency;

an inductor connected between an emitter terminal of the active element and a ground;

an open-ended stub connected to a collector terminal of the active element and having a line length equal to a quarter of the wavelength of the signal of the oscillation frequency;

a first output terminal provided at a connecting point between the collector terminal of the active element and the open-ended stub, to output the signal of the 2N-fold frequency of the oscillation frequency generated by the active element;

a directional coupler having an input terminal connected to a base terminal of the active element, to input the signal of the oscillation frequency generated by the active element from the input terminal, wherein the directional coupler is configured to stop transit of the signal of the 2N-fold frequency of the oscillation frequency;

a resonator connected to a through terminal of the directional coupler and configured to resonate at the oscillation frequency; and a second output terminal connected to a coupled terminal or isolation terminal of the directional coupler, to output the signal of the oscillation frequency output from the coupled terminal or isolation terminal.

24. The oscillator according to claim 1, wherein the oscillator is configured to generate the signal of the oscillation frequency without receiving an input signal including the oscillation frequency.

* * * * *